(12) United States Patent
Sato

(10) Patent No.: US 9,877,405 B2
(45) Date of Patent: Jan. 23, 2018

(54) ELECTRONIC DEVICE AND MOUNTING METHOD

(71) Applicant: FUJITSU LIMITED, Kawasaki-shi, Kanagawa (JP)

(72) Inventor: Yoshiyuki Sato, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/940,824

(22) Filed: Nov. 13, 2015

(65) Prior Publication Data

US 2016/0157375 A1 Jun. 2, 2016

(30) Foreign Application Priority Data

Nov. 27, 2014 (JP) .................. 2014-240111

(51) Int. Cl.
| | | |
|---|---|---|
| H05K 7/00 | (2006.01) | |
| H05K 7/14 | (2006.01) | |
| H05K 9/00 | (2006.01) | |

(52) U.S. Cl.
CPC ......... *H05K 7/1418* (2013.01); *H05K 9/0062* (2013.01); *H05K 9/0067* (2013.01)

(58) Field of Classification Search
None
See application file for complete search history.

(56) References Cited

U.S. PATENT DOCUMENTS

| | | | | |
|---|---|---|---|---|
| 5,325,269 A * | 6/1994 | Someno | ........... | G06F 1/184 361/785 |
| 7,679,933 B2 * | 3/2010 | Makabe | ........... | G06F 1/185 174/365 |
| 8,755,191 B2 * | 6/2014 | Riebel | ........... | H05K 7/1488 361/679.38 |
| 8,934,244 B2 * | 1/2015 | Shelnutt | ........... | H05K 7/20254 312/223.1 |
| 9,454,192 B2 * | 9/2016 | Farrow | ........... | G06F 1/181 |
| 2003/0031002 A1 * | 2/2003 | Siira | ........... | H05K 7/1454 361/796 |
| 2004/0100762 A1 * | 5/2004 | Yuan | ........... | G06F 1/184 361/679.39 |
| 2004/0228634 A1 * | 11/2004 | Fricker | ........... | G02B 6/4453 398/135 |

(Continued)

FOREIGN PATENT DOCUMENTS

| | | |
|---|---|---|
| JP | 61-129395 | 8/1986 |
| JP | 7-212063 | 8/1995 |
| JP | 2011-181568 | 9/2011 |

*Primary Examiner* — Courtney Smith
*Assistant Examiner* — Rashen E Morrison
(74) *Attorney, Agent, or Firm* — Staas & Halsey LLP

(57) ABSTRACT

An electronic device includes a housing; a plug-in unit that is inserted into the housing and electrically connected to a connection substrate within the housing; a guiding member that includes a retention portion retaining the plug-in unit, the guiding member being moved between a protruding position protruding from the housing to a front side of an insertion direction of the plug-in unit and a retracting position retracting to the housing side, the guiding member being electrically connected to the housing; a biasing member that biases the guiding member to the protruding position; and a conductive member that is positioned between the plug-in unit and the guiding member, the plug-in unit and the guiding member being in a conduction state by the conductive member.

16 Claims, 34 Drawing Sheets

(56) References Cited

U.S. PATENT DOCUMENTS

| | | | |
|---|---|---|---|
| 2005/0243507 A1* | 11/2005 | Lambert | G06F 1/187 361/679.39 |
| 2007/0035933 A1* | 2/2007 | Chuang | H05K 7/1492 361/752 |
| 2007/0091559 A1* | 4/2007 | Malone | G06F 1/187 361/679.32 |
| 2007/0140787 A1* | 6/2007 | Champion | G06F 1/183 403/321 |
| 2007/0201210 A1* | 8/2007 | Chow | H05K 7/20727 361/704 |
| 2009/0097200 A1* | 4/2009 | Sharma | G06F 1/18 361/688 |
| 2009/0097201 A1* | 4/2009 | Ahmad-Taylor | H05K 7/20127 361/692 |
| 2009/0161312 A1* | 6/2009 | Spearing | H05K 7/20727 361/679.47 |
| 2010/0321874 A1* | 12/2010 | Bhattacharyya | H05K 7/20736 361/679.5 |
| 2012/0048685 A1* | 3/2012 | Chen | B65G 25/02 198/750.1 |
| 2012/0075815 A1* | 3/2012 | Fuke | H05K 7/1409 361/756 |
| 2012/0108093 A1* | 5/2012 | Sato | H01R 13/62994 439/160 |
| 2012/0113581 A1* | 5/2012 | Anguiano-Wehde | G06F 1/187 361/679.33 |
| 2015/0195943 A1* | 7/2015 | Fricker | H05K 7/1409 361/679.58 |

* cited by examiner

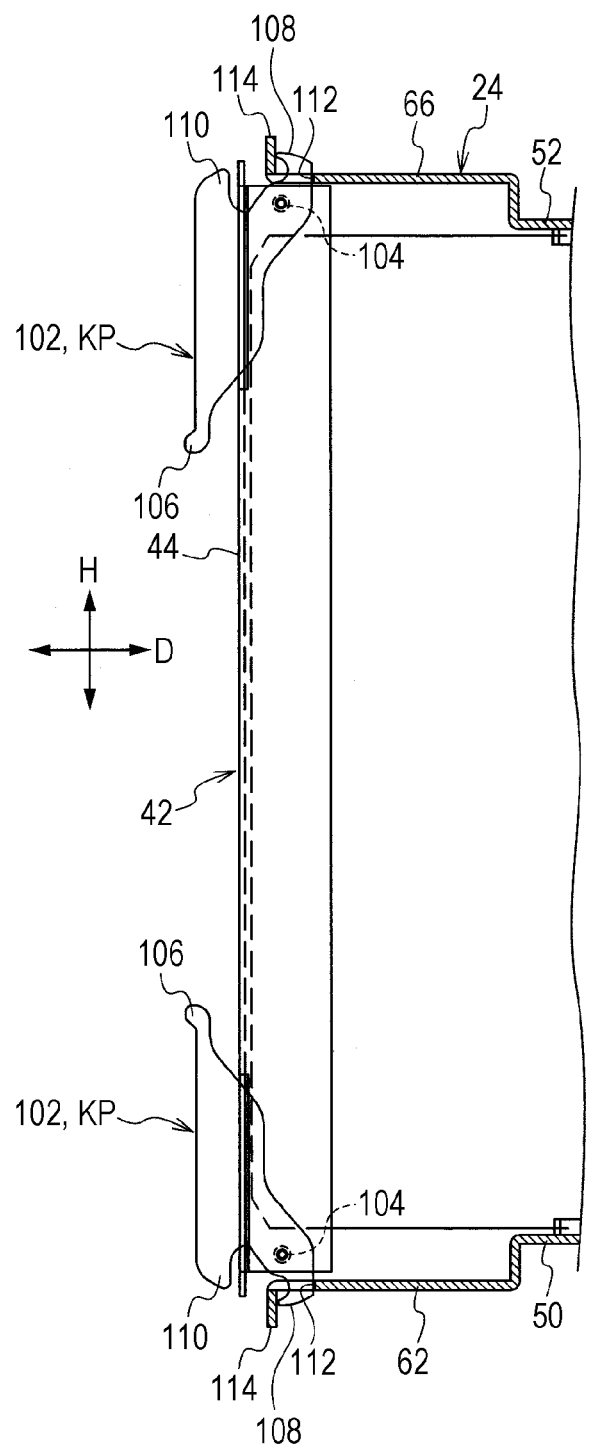

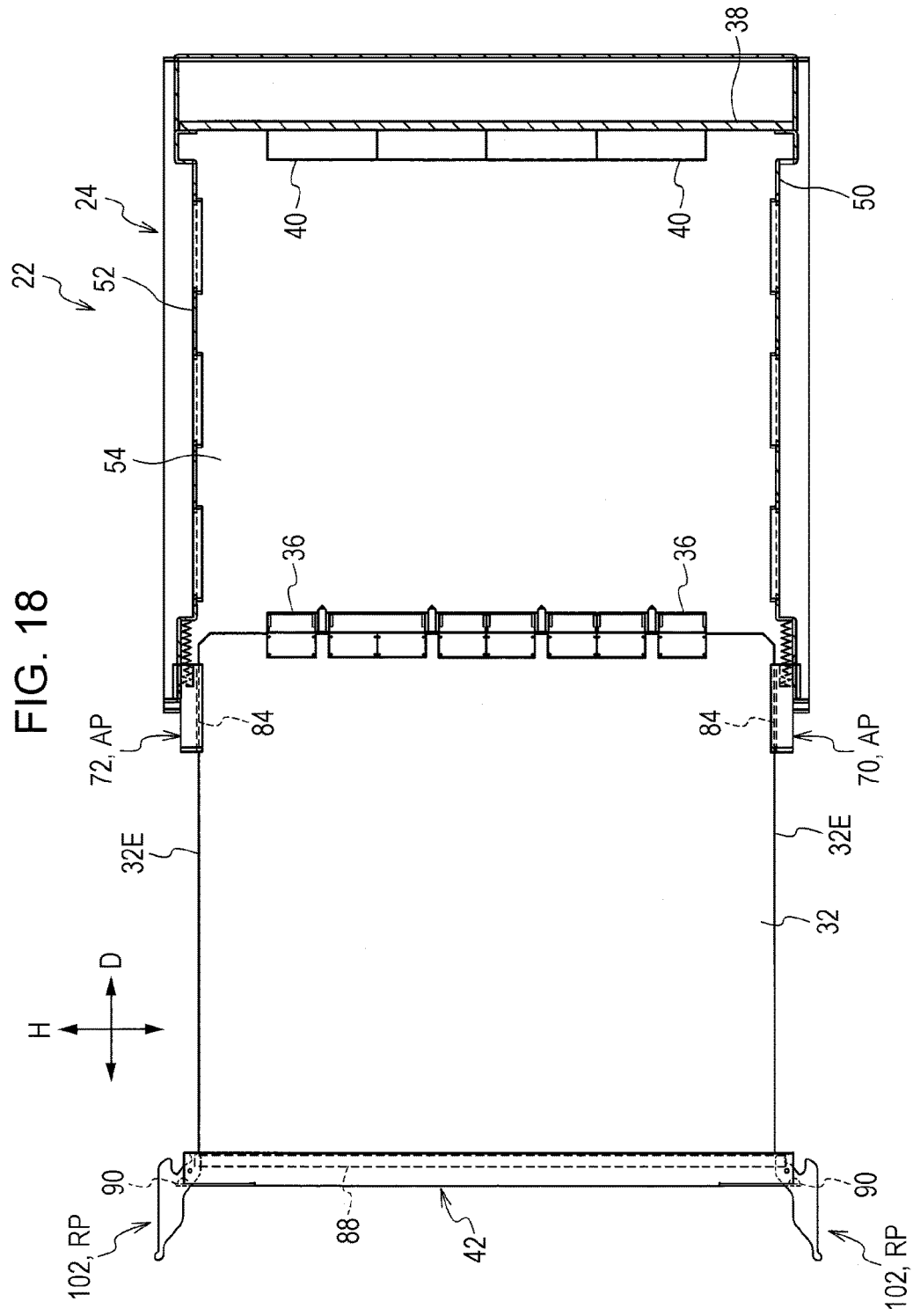

ELECTRONIC DEVICE AND MOUNTING METHOD

CROSS-REFERENCE TO RELATED APPLICATION

This application is based upon and claims the benefit of priority of the prior Japanese Patent Application No. 2014-240111, filed on Nov. 27, 2014, the entire contents of which are incorporated herein by reference.

FIELD

The embodiments discussed herein are related to an electronic device and a mounting method.

BACKGROUND

There is a printed circuit board mounting shelf in which guide portions of a sectional concave shape are arranged in parallel by being positioned to oppose to each other on an upper side and a lower side of the shelf, and a tip of the lower side guide portion is positioned in front of a tip of the upper side guide portion at the time of inserting a printed circuit board.

Moreover, there is a housing structure in which a conductive tongue-shaped piece is arranged in a housing, and the conductive tongue-shaped piece protrudes between grooves of the housing so as to be in contact with a conductive metal piece which is connected to a predetermined signal line within a plug-in unit at the time of the insertion.

Furthermore, there is a structure in which a braking portion is provided in an auxiliary rail of a shell portion such that a slide accommodation speed of a plug-in rail is reduced.

Japanese Laid-open Patent Publication No. 7-212063, Japanese Laid-open Utility Model Publication No. 61-129395, and Japanese Laid-open Patent Publication No. 2011-181568 are examples of related art.

SUMMARY

According to an aspect of the invention, an electronic device includes a housing; a plug-in unit that is inserted into the housing and electrically connected to a connection substrate within the housing; a guiding member that includes a retention portion retaining the plug-in unit, the guiding member being moved between a protruding position protruding from the housing to a front side of an insertion direction of the plug-in unit and a retracting position retracting to the housing side, the guiding member being electrically connected to the housing; a biasing member that biases the guiding member to the protruding position; and a conductive member that is positioned between the plug-in unit and the guiding member, the plug-in unit and the guiding member being in a conduction state by the conductive member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 16D is a sectional view illustrating the electronic device according to the first embodiment in the enlarged state at the vicinity of the lever;

FIG. 18 is a sectional view illustrating the electronic device according to the first embodiment when illustrated at the section of the front-back direction;

DESCRIPTION OF EMBODIMENTS

When a plug-in unit is mounted by inserting the plug-in unit into a housing of an electronic device, it is desirable to facilitate an alignment at the time of the insertion.

Moreover, in order to suppress a leakage of an electromagnetic wave from the plug-in unit within the housing, and to release static electricity of a worker at the time of an insertion work, a conductive member may be arranged between the plug-in unit and the housing. For example, the conductive member is arranged on a front cover of the plug-in unit.

In order to release the static electricity of the worker before the plug-in unit is electrically connected to the housing, it is desirable to position the above-described conductive member on a deep side of an insertion direction of the plug-in unit. However, when the front cover is enlarged on the rear side (deep side) in order to position the conductive member on the deep side, the front cover may cover a passing region (ventilation region) of the cooling wind or the like within the housing.

Accordingly, it is desired to facilitate the alignment at the time of inserting the plug-in unit into the housing and to secure a wide ventilation region within the housing while achieving the suppression of the leakage of the electromagnetic wave from the plug-in unit and the discharge of the static electricity of the mounting worker.

A first embodiment will be described in detail based on drawings.

Figure 1:
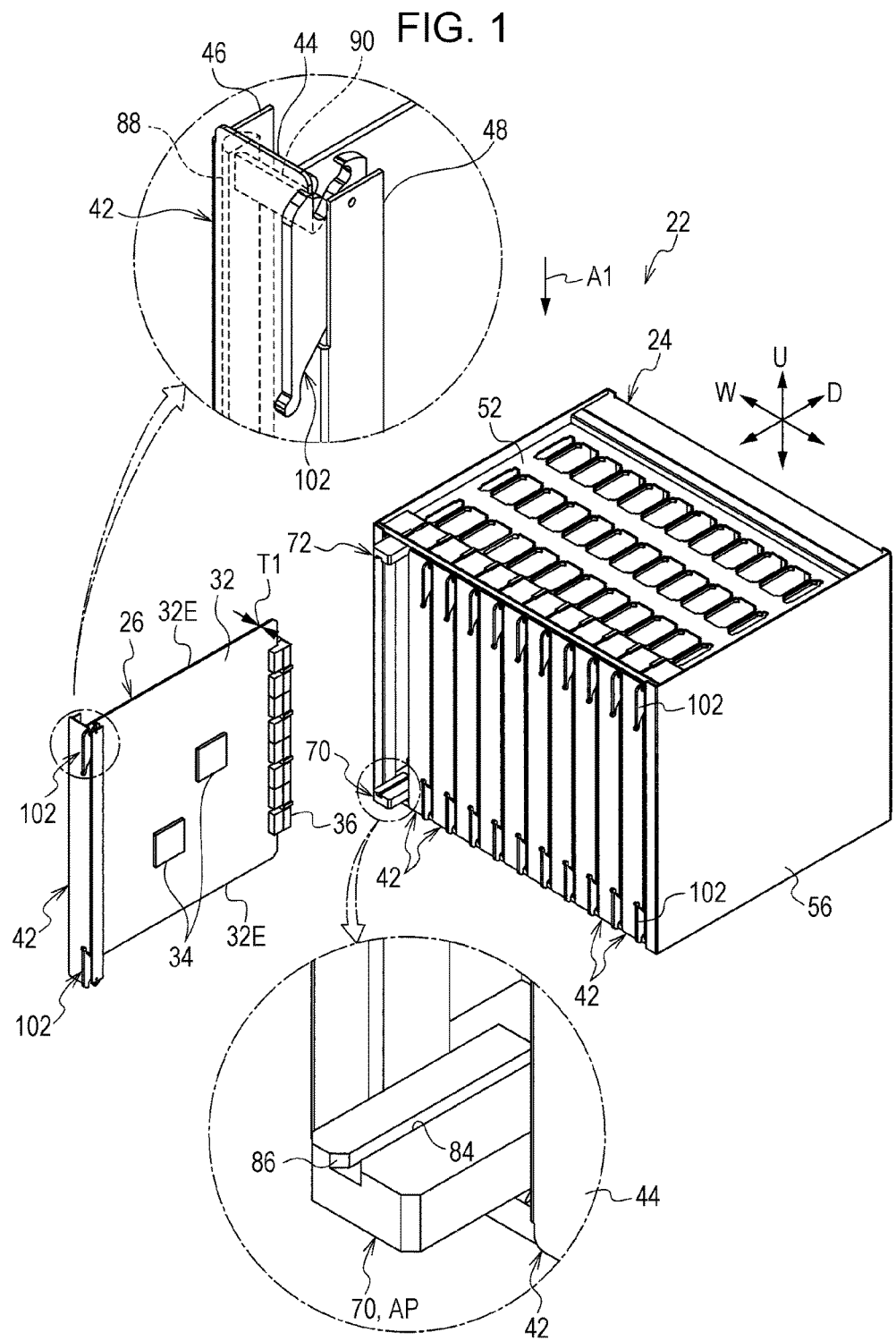
FIG. 1 is an exploded perspective view illustrating an electronic device according to a first embodiment.

As illustrated in FIG. 1, an electronic device 22 according to the first embodiment, includes a sub-rack 24. The sub-rack 24 is an example of a housing. Within the sub-rack 24, a plurality of plug-in units 26 are mounted in a state of being arranged in parallel in a width direction by being inserted thereinto. In the drawings, an up-down direction, the width direction and a front-back direction of the sub-rack 24 are respectively illustrated by an arrow U, an arrow W, and an arrow D. In the sub-rack 24, a side where a backplane 38 described later is arranged is referred to as a back side (rear side). Therefore, a front side of the sub-rack 24 is a front side of an insertion direction at the time of inserting the plug-in unit 26.

Figure 4:
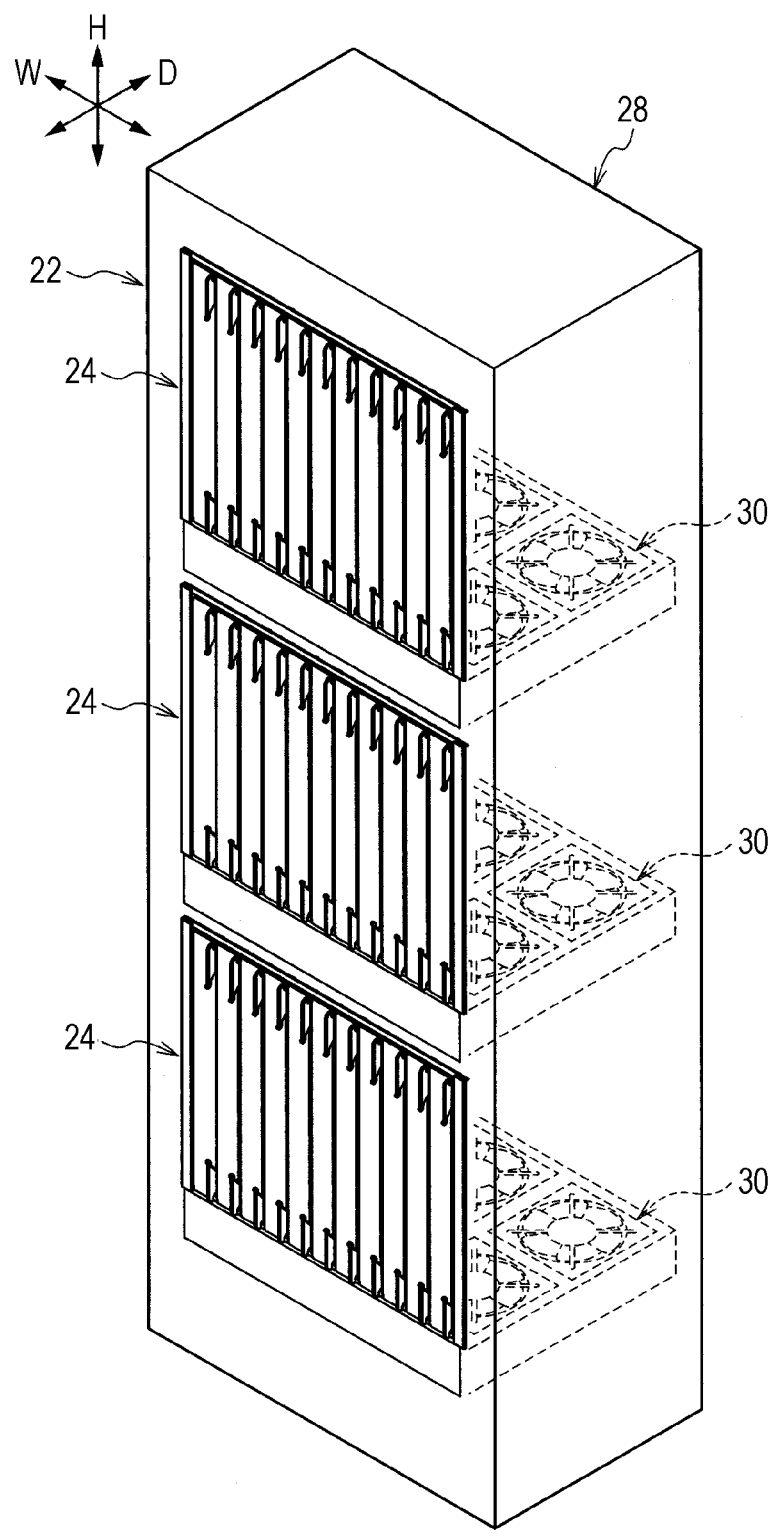
FIG. 4 is a perspective view illustrating the electronic device according to the first embodiment.

As illustrated in FIG. 4, for example, the sub-racks 24 are positioned in a plurality of steps (three steps in the example of FIG. 4) in the up-down direction, and are mounted in a main rack 28. In the main rack 28, a fan 30 is positioned on a lower side (or upper side) of the sub-rack 24. The fan 30 cools the plug-in unit 26 by sending the wind to the plug-in unit 26. Furthermore, the wind for cooling the plug-in unit 26 may be obtained by a member or a structure other than the fan 30.

The plug-in unit 26 includes a printed circuit board 32. The printed circuit board 32 is formed into a plate shape by a material (for example, glass epoxy) having rigidity and insulating properties. Various types of electronic components 34 are mounted on the printed circuit board 32.

Figure 12:
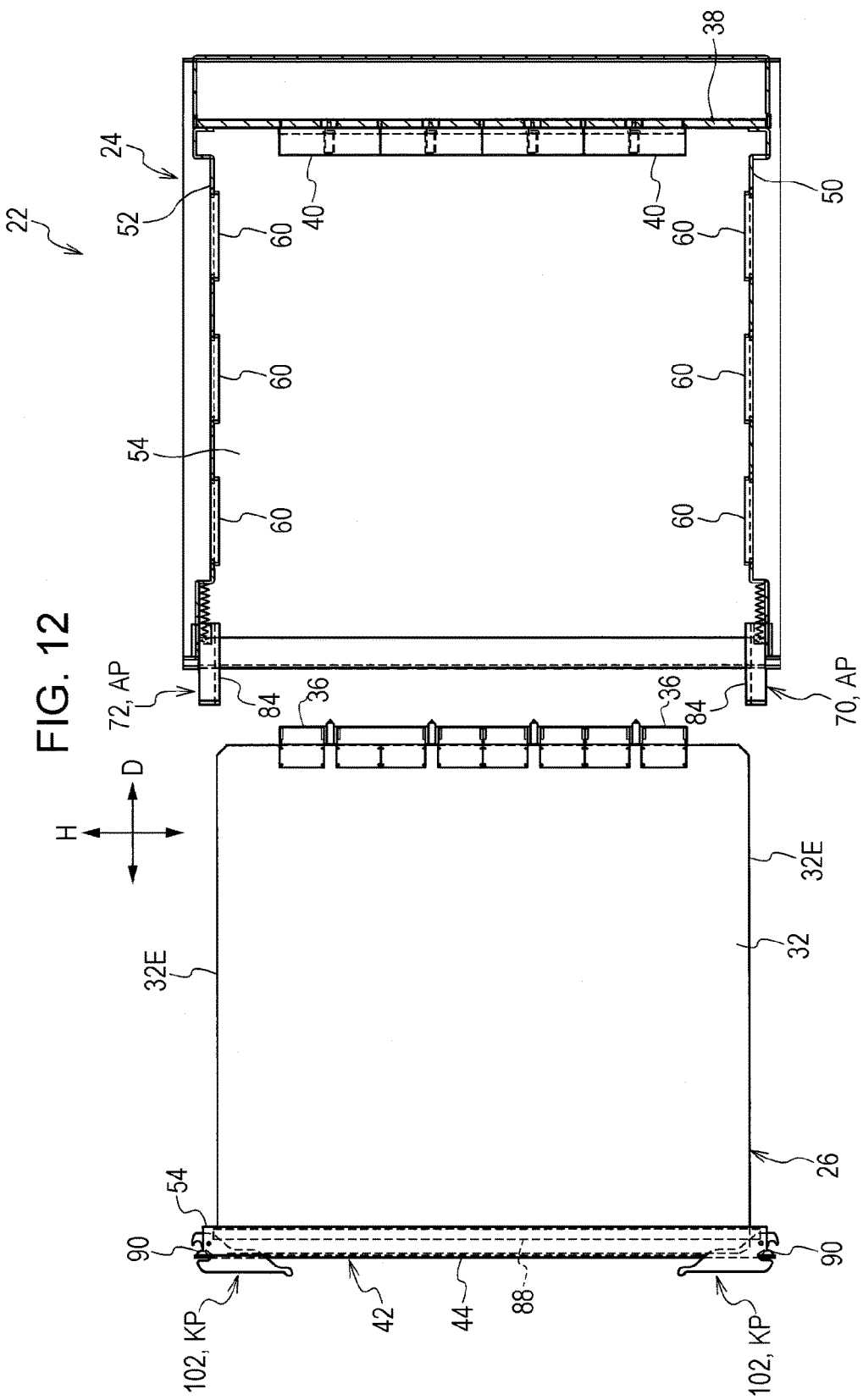
FIG. 12 is a sectional view illustrating the electronic device according to the first embodiment when illustrated at a section of a front-back direction.

As illustrated in FIG. 1 and FIG. 12, a connector 36 is arranged on the back side of the printed circuit board 32. The connector 36 is electrically connected to a connector 40 of the backplane 38 within the sub-rack 24 (see FIG. 14 and FIG. 21).

The plug-in unit 26 includes a front panel 42. As illustrated in FIG. 1, the front panel 42 includes a front plate 44, a left plate 46, and a right plate 48. The front plate 44 is positioned on the front side of the plug-in unit 26. Each of the left plate 46 and the right plate 48 extend to the back side from the left and the right of the front plate 44. That is, the front panel 42 has a flat U-shaped form as being open on the back side in a planar view (view of an arrow A1 direction).

Figure 5:
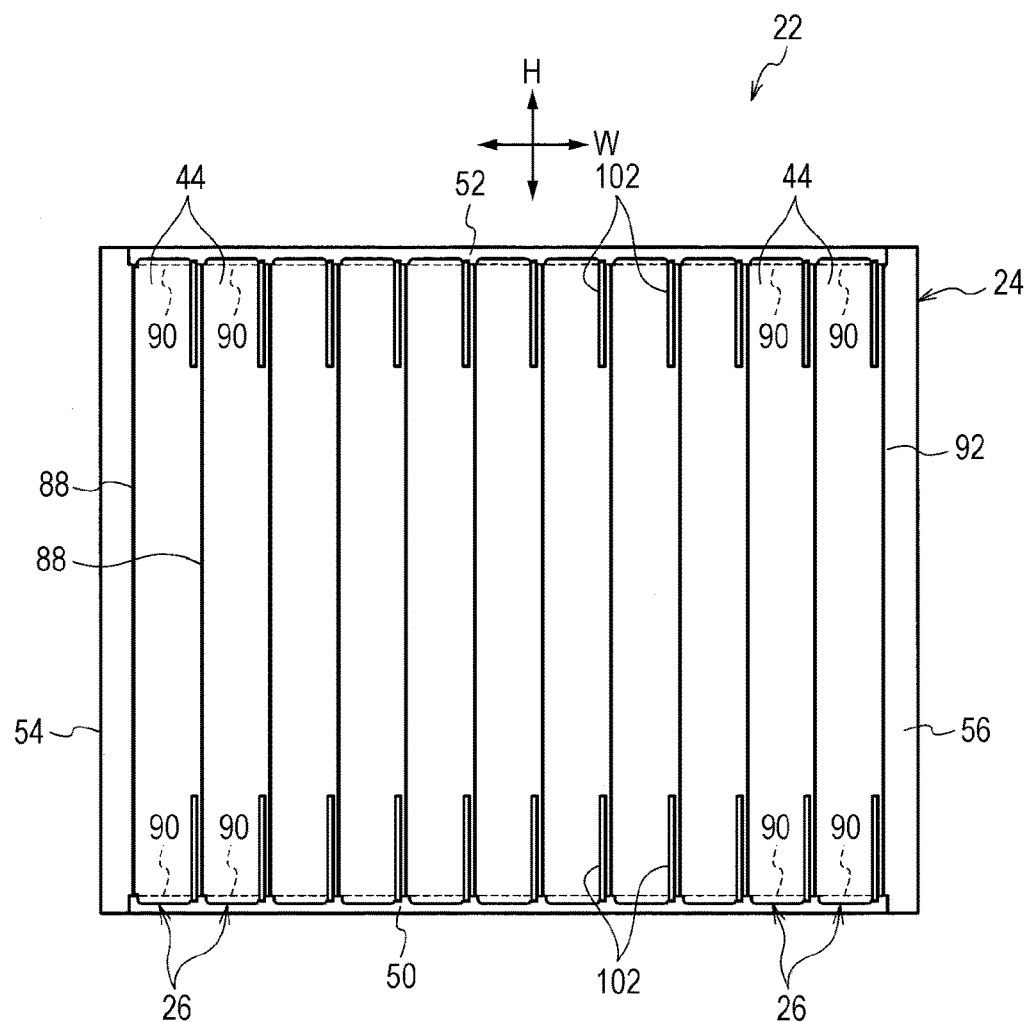
FIG. 5 is a front view illustrating the electronic device according to the first embodiment.
Figure 14:
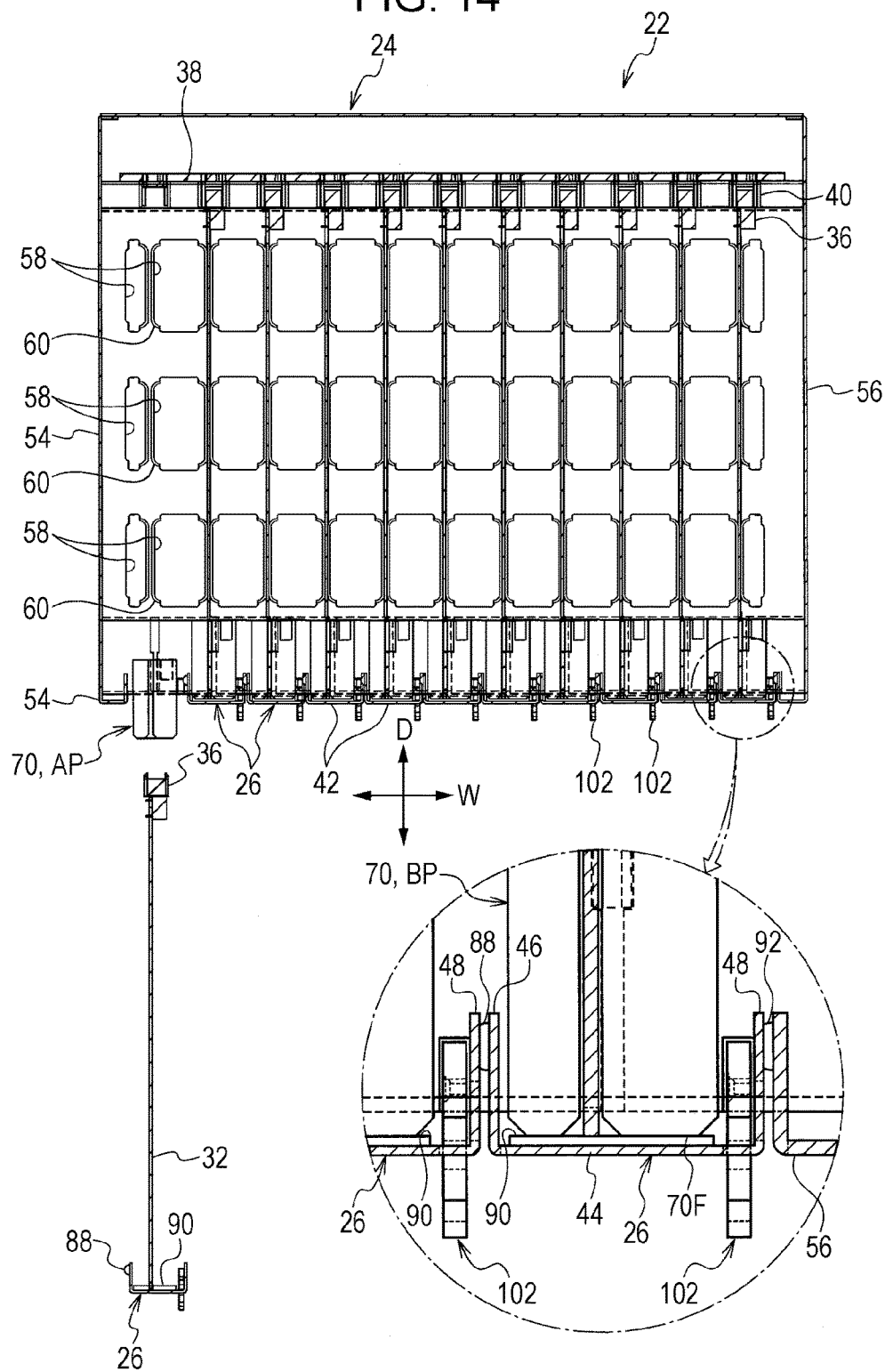
FIG. 14 is a sectional view illustrating the electronic device according to the first embodiment when illustrated at the section of the front-back direction.

As illustrated in FIG. 5 and FIG. 14, the front panel 42 is positioned at the same position in the front-back direction as the front panel 42 of the plug-in unit 26 which is adjacent to each other in the state where the plug-in unit 26 is mounted in the sub-rack 24, and the overall front panels 42 form a front face of the sub-rack 24.

Figure 2:
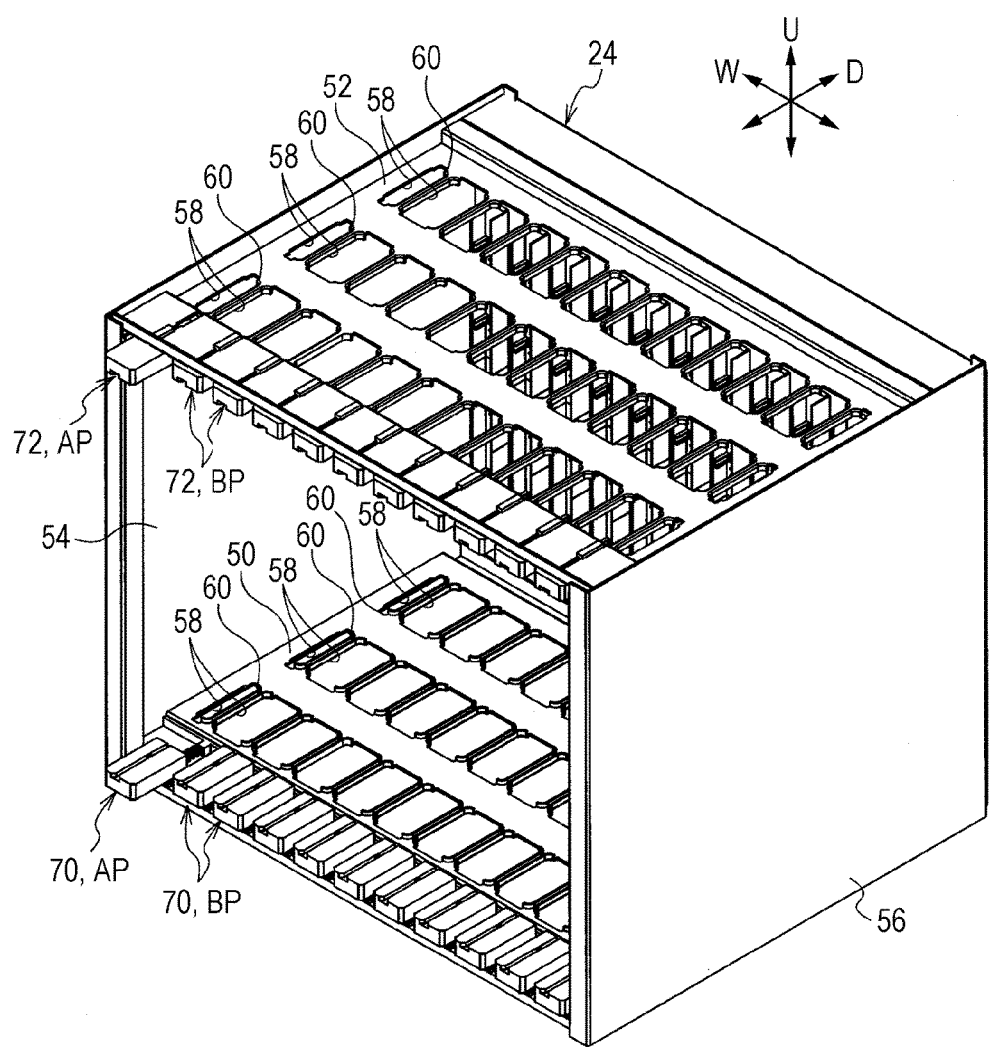
FIG. 2 is a perspective view illustrating a sub-rack of the electronic device according to the first embodiment.
Figure 3:
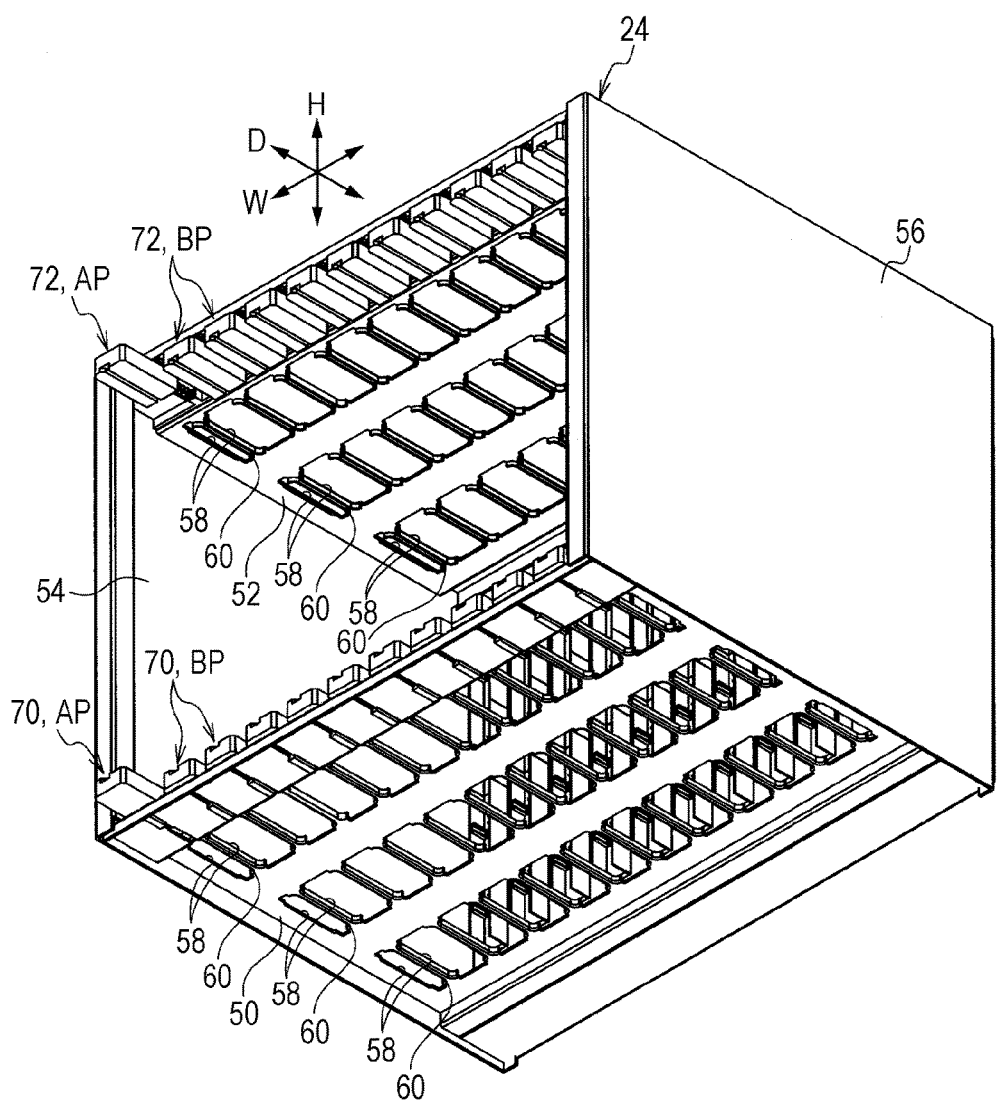
FIG. 3 is a perspective view illustrating the sub-rack of the electronic device according to the first embodiment.

As illustrated in FIG. 2 and FIG. 3, the sub-rack 24 is a box-shaped member which includes a lower plate 50, an upper plate 52, a left side plate 54, and a right side plate 56. All of the lower plate 50, the upper plate 52, the left side plate 54 and the right side plate 56 are made of metals. The sub-rack 24 is connected to the earth.

Figure 21:
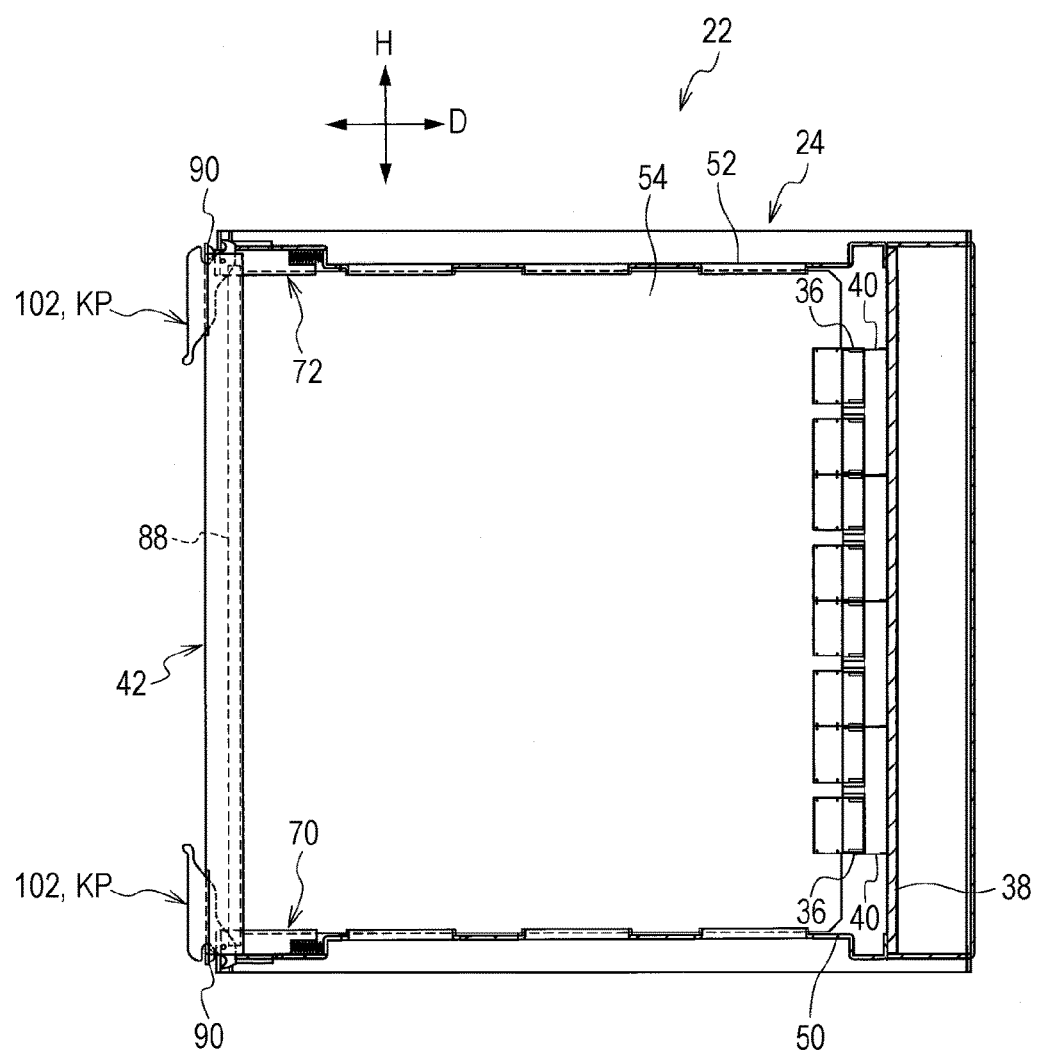
FIG. 21 is a sectional view illustrating the electronic device according to the first embodiment when illustrated at the section of the front-back direction.

As illustrated in FIG. 14 and FIG. 21, the backplane 38 is positioned on the back side of the sub-rack 24. In the backplane 38, a plurality of connectors 40 are arranged in parallel in the up-down direction and the width direction. When the plurality of plug-in units 26 are mounted in a mounting position within the sub-rack 24, each of the connectors 40 are electrically connected to the connector 36. Hereby, the printed circuit board 32 of the plug-in unit 26 is electrically connected to the backplane 38.

As illustrated in FIG. 2 and FIG. 3, a plurality of hole portions 58 are formed in the lower plate 50 and the upper plate 52 of the sub-rack 24. The hole portion 58 penetrates the upper plate 52 and the lower plate 50 in a thickness direction. On both sides of the width direction in the penetration portion, a portion of plate materials of the lower plate 50 and the upper plate 52 is cut and raised.

In the example illustrated in FIG. 2 and FIG. 3, the hole portion 58 is formed into three arrays in the front-back direction, and is formed to be one more than the number of the mounted plug-in units 26 in the width direction. However, the hole portions 58 of both ends of the width direction are narrower in comparison with the hole portion 58 other than the hole portions 58 of both ends.

A portion between the cut and raised portions of the hole portions 58 which are adjacent thereto in the width direction, becomes a guiding rail 60. The width of the guiding rail 60 is slightly wider than a thickness T1 of the printed circuit board 32. The guiding rail 60 correlates with each of the plurality of plug-in units 26, and is formed in the front-back direction. When the plug-in unit 26 is inserted into the sub-rack 24, an edge portion (upper edge portion and lower edge portion) 32E of the printed circuit board 32 is accommodated within the guiding rail 60.

Figure 6:
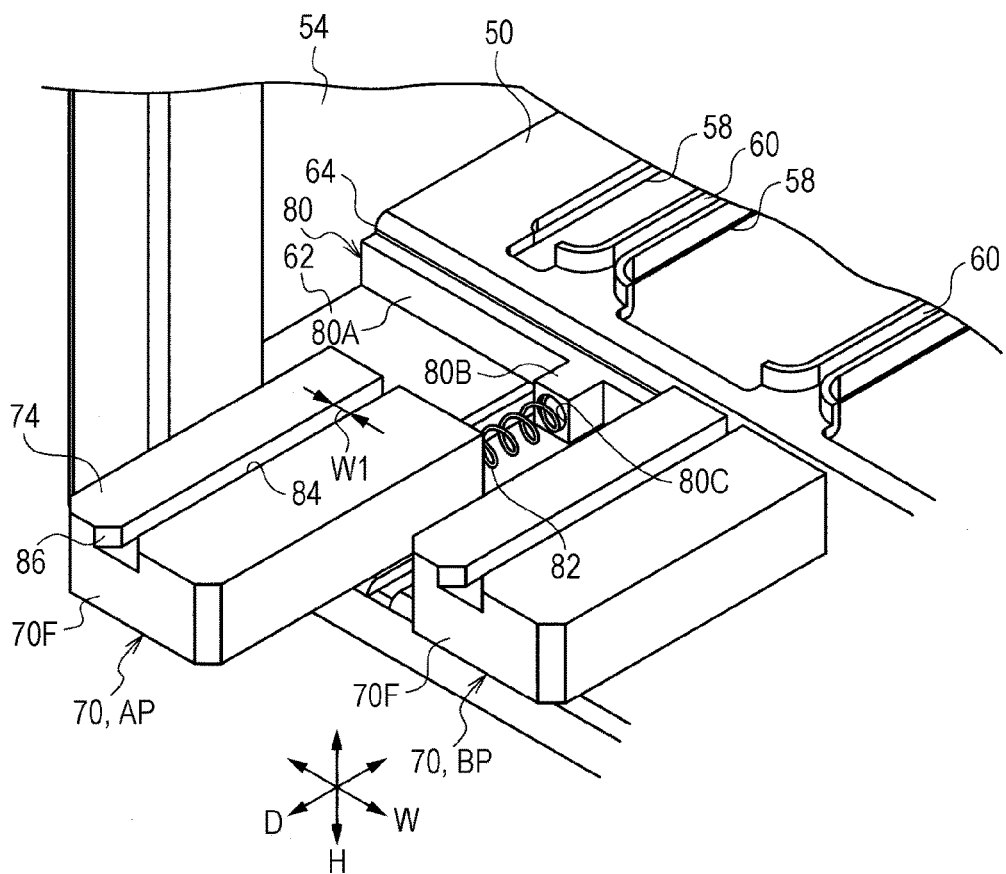
FIG. 6 is a perspective view illustrating the sub-rack of the electronic device according to the first embodiment in an enlarged state at the vicinity of a guiding member.
Figure 7:
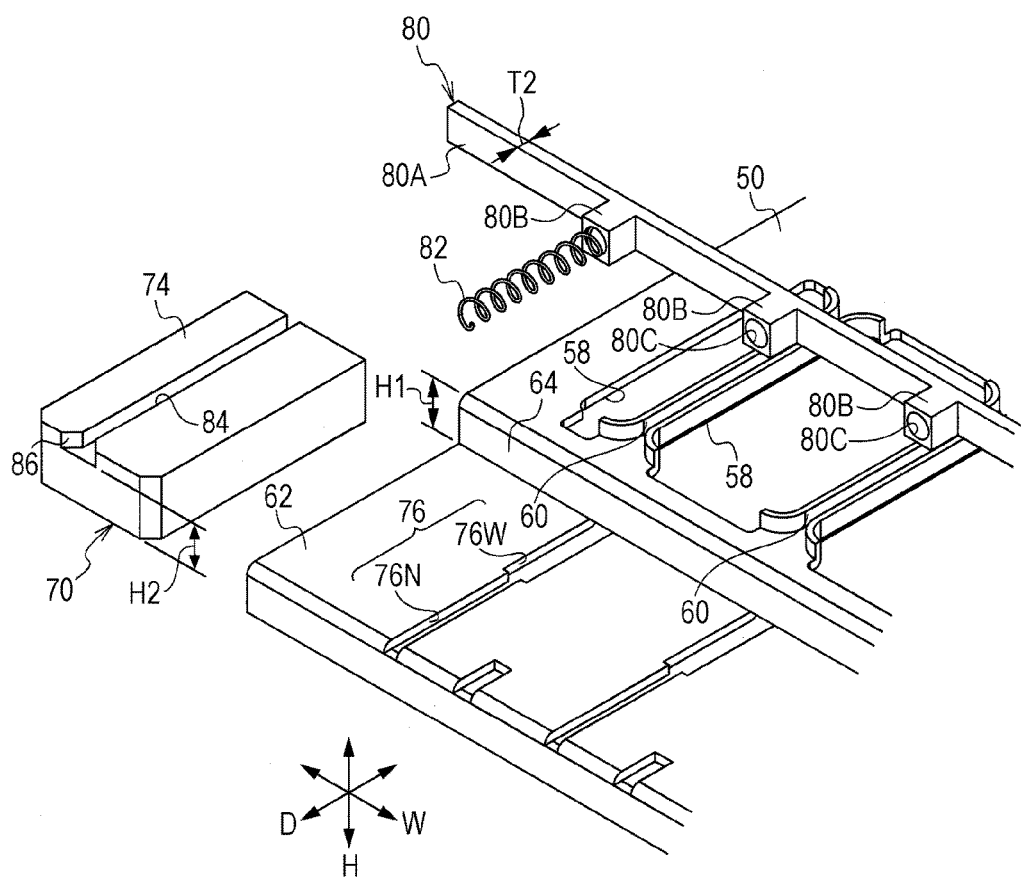
FIG. 7 is an exploded perspective view illustrating the sub-rack of the electronic device according to the first embodiment in the enlarged state at the vicinity of the guiding member.
Figure 10:
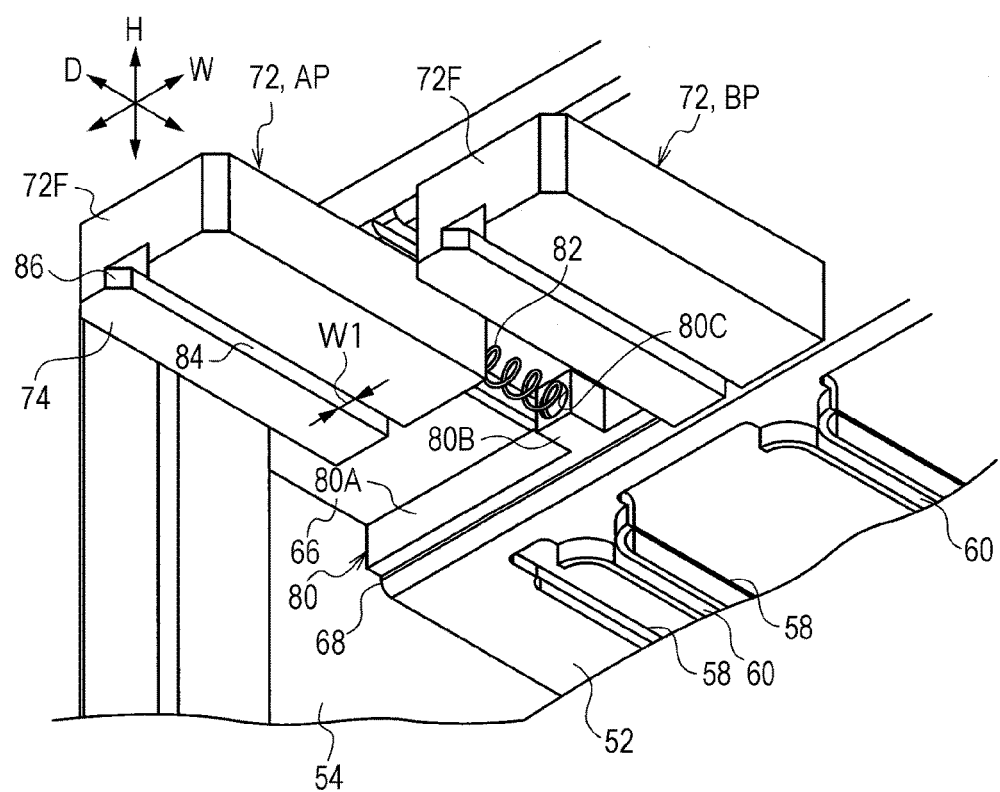
FIG. 10 is a perspective view illustrating the sub-rack of the electronic device according to the first embodiment in the enlarged state at the vicinity of the guiding member.
Figure 11:
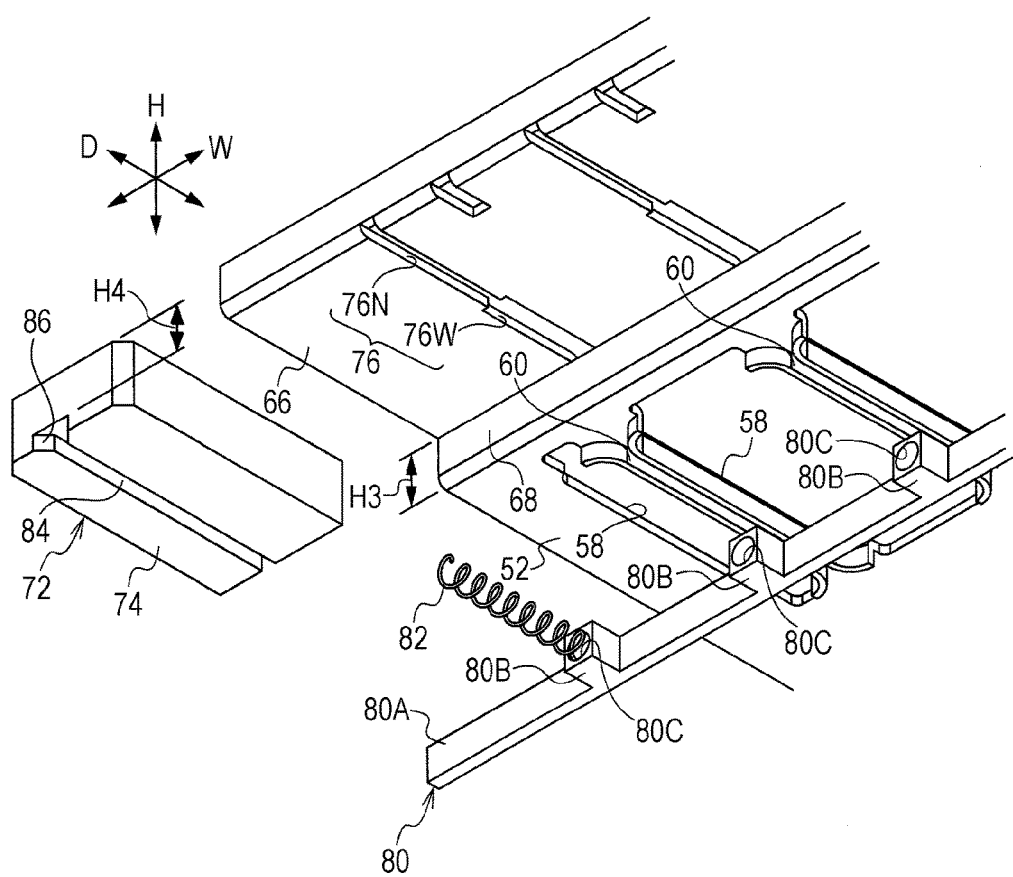
FIG. 11 is an exploded perspective view illustrating the sub-rack of the electronic device according to the first embodiment in the enlarged state at the vicinity of the guiding member.

As illustrated in FIG. 6 and FIG. 7, a step portion 62 which generates a step difference 64 toward the lower side is formed on the front side of the lower plate 50. In the same manner, as illustrated in FIG. 10 and FIG. 11, a step portion 66 which generates a step difference 68 toward the upper side is also formed on the front side of the upper plate 52.

In the step portion 62, a plurality of guiding members 70 are arranged in parallel in the width direction. In the first embodiment, a height H1 of the step difference 64 of the step portion 62 is equal to a height H2 of the guiding member 70.

Similarly, in the step portion 66, a plurality of guiding members 72 are arranged in parallel in the width direction. In the first embodiment, a height H3 of the step difference 68 of the step portion 66 is equal to a height H4 of the guiding member 72.

The guiding members 70 and 72 are arranged by the same number as the number of the plug-in units 26 in each of the lower plate 50 and the upper plate 52. Hereinafter, the guiding member 70 which is arranged in the lower plate 50 will be described, but as illustrated in FIG. 7 and FIG. 11, there is a structure where the guiding member 70 which is arranged in the lower plate 50 and the guiding member 72 which is arranged in the upper plate 52 are symmetrical up and down. Moreover, hereinafter, a face of each of the guiding members 70 and 72 opposing to each other is simply referred to as an opposing face 74. Since the height H1 of the step difference 64 is equal to the height H2 in a bottom portion of an accommodation groove 84 (which will be described later in detail) of the guiding member 70, the bottom portion of the accommodation groove 84 of the guiding member 70 is the same face as an upper face of the lower plate 50. Since the height H3 of the step difference 68 is equal to the height H4 in the bottom portion of the accommodation groove 84 of the guiding member 72, the bottom portion of the accommodation groove 84 of the guiding member 72 is the same flat face as a lower face of the upper plate 52.

Figure 8:
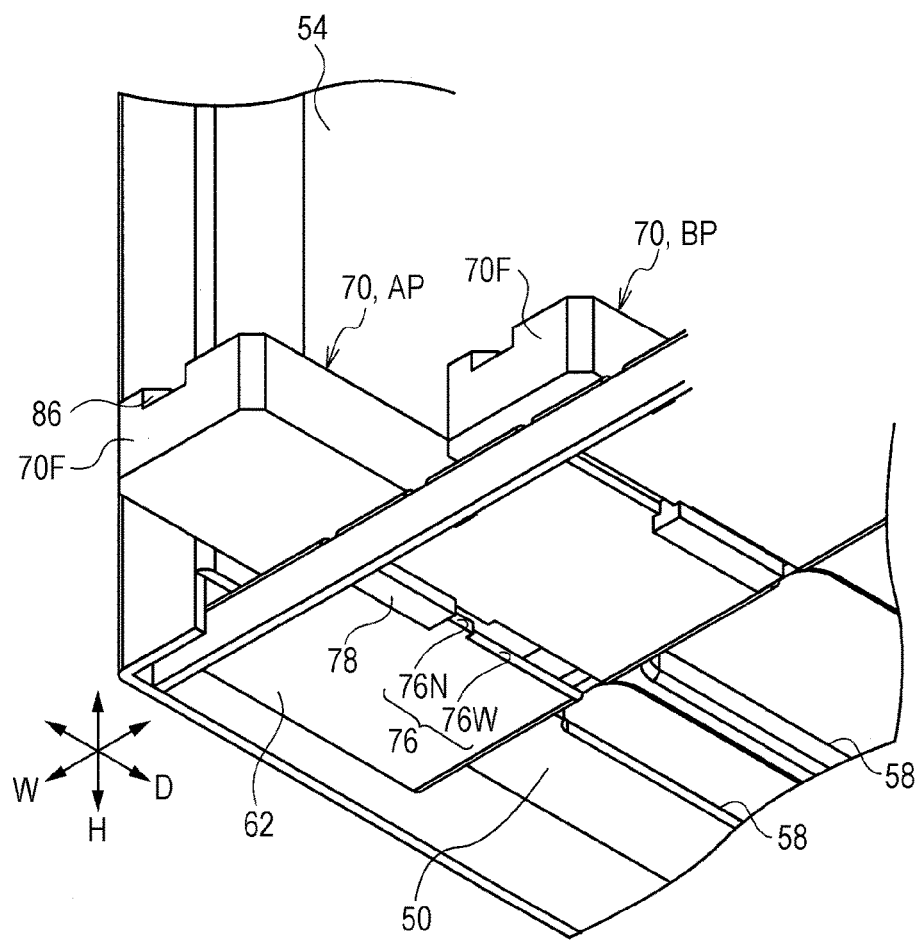
FIG. 8 is a perspective view illustrating the sub-rack of the electronic device according to the first embodiment in the enlarged state at the vicinity of the guiding member.
Figure 9:
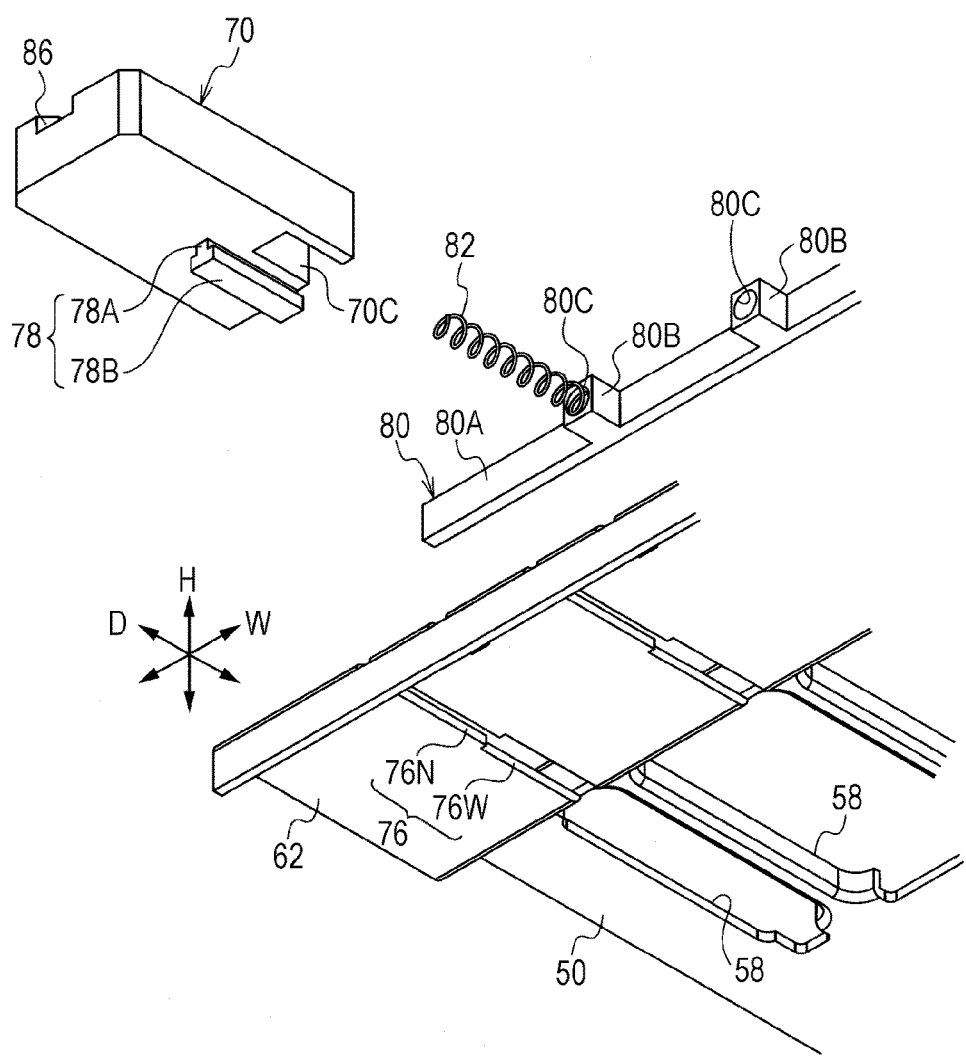
FIG. 9 is an exploded perspective view illustrating the sub-rack of the electronic device according to the first embodiment in the enlarged state at the vicinity of the guiding member.

As illustrated in FIG. 8 and FIG. 9, in the lower plate 50, a slit 76 is formed into a straight line shape along the front-back direction. A protruding branch portion 78 protruding from the guiding member 70 is accommodated in the slit 76. Hereby, the guiding member 70 is retained in the lower plate 50, and smoothly slides in the front-back direction. In a case of the guiding member 72, since the protruding branch portion 78 is also accommodated in the slit 76, the guiding member 72 is retained in the upper plate 52, and slides in the front-back direction.

As illustrated in FIG. 6 and FIG. 10, each of the guiding members 70 and 72 are positioned at a retracting position BP where the whole thereof retracts into the sub-rack 24, in the state of sliding to the back side. In contrast thereto, when the guiding members 70 and 72 slide to the front side, the front side portion of the guiding members 70 and 72 reaches a protruding position AP of protruding to the front side from the sub-rack 24.

The sliding motion of the guiding members 70 and 72 to the front side is limited by that a front end of the protruding branch portion 78 is hit with a front end of the slit 76. The sliding motion of the guiding member 70 to the back side is limited by that the guiding member 70 is hit with a spring stand 80 described later. That is, the sliding motion of the guiding member 70 in the front-back direction is limited in a predetermined scope.

As illustrated in FIG. 8 and FIG. 9, the slit 76 includes a width narrowing portion 76N of the front side, and a width widening portion 76W of which the width is wider than that of the width narrowing portion 76N on the back side. In contrast thereto, an accommodation portion 78A of the position which is close to the guiding member 70, and an engaging portion 78B of the position which is distant from the guiding member 70 are formed in the protruding branch portion 78. The width of the accommodation portion 78A is narrower than that of the width narrowing portion 76N of the slit 76. The width of the engaging portion 78B is narrower than that of the width widening portion 76W of the slit 76. A length of the protruding branch portion 78 in the front-back direction is slightly shorter than a length of the width widening portion 76W.

Therefore, each of the guiding members 70 and 72 are positioned on the back side, and it is possible to insert the engaging portion 78B of the protruding branch portion 78 into the width widening portion 76W of the slit 76. When the guiding members 70 and 72 slide to the front side in the state of inserting the engaging portion 78B into the width widening portion 76W in this manner, the engaging portion 78B is engaged with the width narrowing portion 76N.

Between the step portion 62 and the guiding member 70 and between the step portion 66 and the guiding member 72, each the spring stand 80 is provided. The spring stand 80 includes a long portion 80A extending in the width direction, and a plurality of protruding portions 80B protruding to the front side from the long portion 80A. The protruding portion 80B correlates with the guiding member 70 one on one.

A spring accommodation portion 80C which is open toward the front side is formed in the protruding portion 80B. In the guiding member 70, a depression portion 70C which is open toward the back side is formed (see FIG. 9). A coil spring 82 is accommodated between the spring accommodation portion 80C and the depression portion 70C. The coil spring 82 energizes or biases the guiding member 70 toward the front side (protruding position AP).

Specifically, as described above, the spring stand 80 is attached to the step difference 64, in the state where the guiding member 70 slides to the front side by inserting the engaging portion 78B into the width widening portion 76W. The long portion 80A of the spring stand 80 has a thickness T2 (see FIG. 7) in the front-back direction. Hence, when the guiding member 70 is hit with the long portion 80A by sliding to the back side, the state where the front side portion of the engaging portion 78B is engaged with the back side portion of the width narrowing portion 76N is maintained. Hereby, a dropout from the step portion 62 of the guiding member 70 is averted.

As illustrated in FIG. 6 and FIG. 10, an accommodation groove 84 is formed on the opposing face 74 of each of the guiding members 70 and 72. The accommodation groove 84 is a groove of the straight line shape which is continuous up to the back end from the front end of the guiding members 70 and 72 in the front-back direction.

A groove width W1 of the accommodation groove 84 is slightly wider than the thickness T1 of the printed circuit board 32. By accommodating the upper edge portion and the lower edge portion 32E of the printed circuit board 32 in the accommodation groove 84, it is possible to guide the movement of the plug-in unit 26 to the back side. Since the guiding member 70 is biased toward the front side by the coil spring 82, the sliding motion of the guiding member 70 to the back side is suppressed even when the plug-in unit 26 is pushed to the back side. Therefore, a gasket 88 is in contact with the guiding member 70 before the connectors 36 and 40 are connected. After the gasket 88 comes in contact with the guiding member 70, when the plug-in unit 26 is further pushed to the back side, the guiding member 70 resists the biasing force of the coil spring 82, and is moved to the back side until being hit with the spring stand 80.

A taper portion 86 of which the width becomes gradually wider toward the front side is formed on the front side of the accommodation groove 84. In the first embodiment, the taper portion 86 is formed into an isosceles triangle shape in a plan view, and is formed into a symmetrical shape in the width direction by assuming the accommodation groove 84 as a center.

Figure 13:
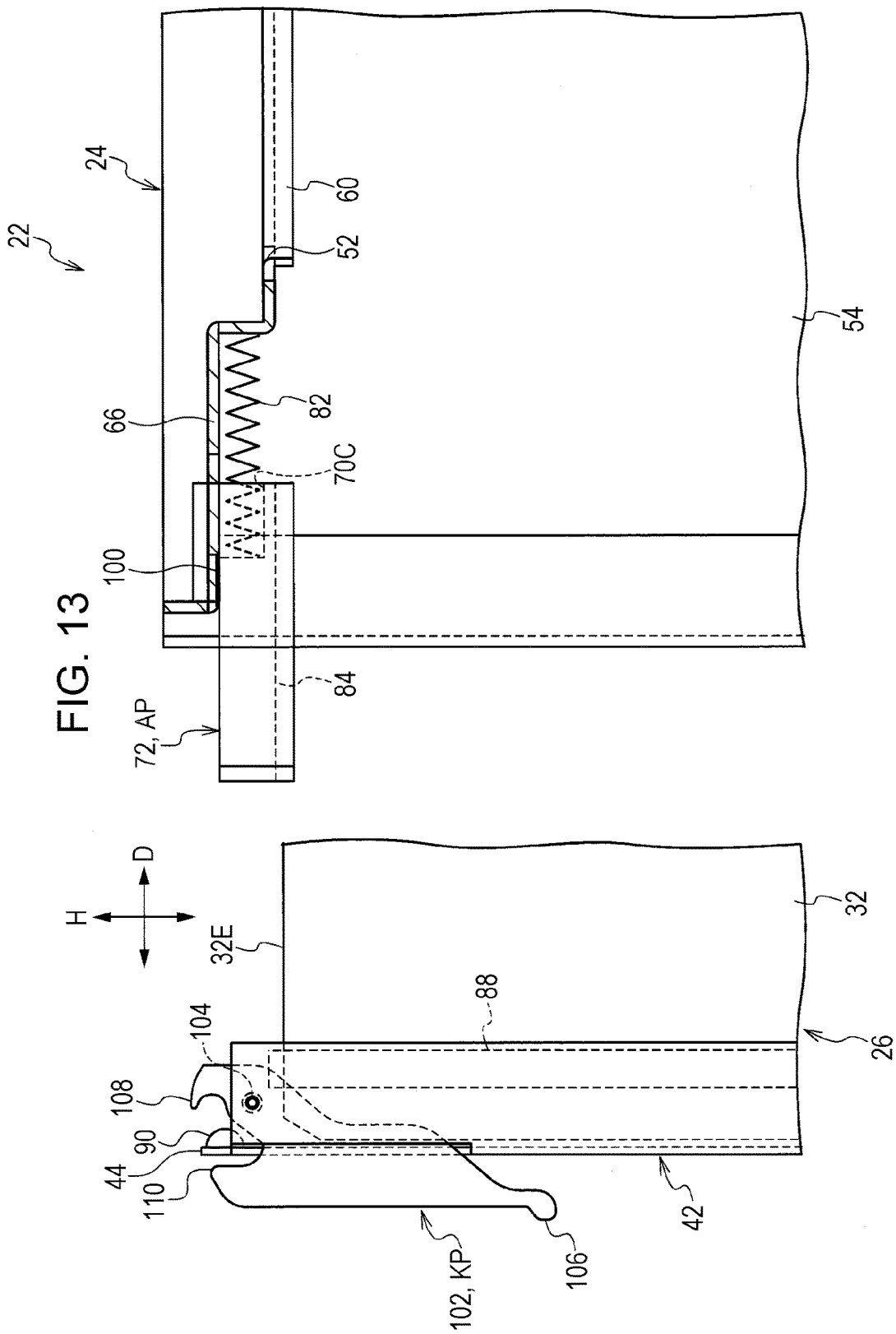
FIG. 13 is an enlarged sectional view illustrating the electronic device according to the first embodiment when illustrated at the section of the front-back direction.

As illustrated in FIG. 1, FIG. 12, and FIG. 13, the gasket 88 is attached to the left plate 46 of each plug-in unit 26 along the up-down direction. The gasket 88 is continuous from the upper portion to the lower portion of the left plate 46 in one left plate 46.

A gasket 90 is attached to the upper portion and the lower portion of the front plate 44 of the plug-in unit 26 along the width direction. Each gasket 90 is continuous in one front plate 44 in the width direction.

As illustrated in FIG. 5 and FIG. 14, a gasket 92 is attached to an inner face of the right side plate 56 of the sub-rack 24 along the up-down direction. The gasket 92 is continuous from the upper portion to the lower portion, in a range where the right side plate 56 and the plug-in unit 26 faces to each other.

Figure 15:
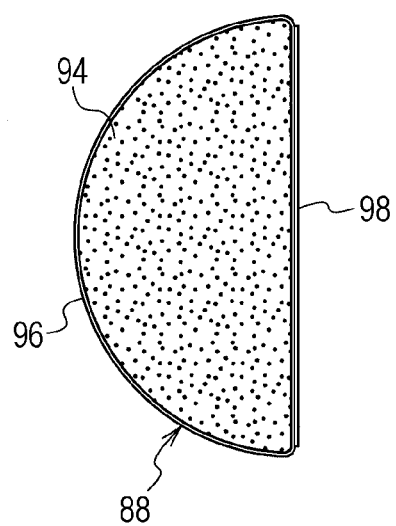
FIG. 15 is a sectional view illustrating a gasket of the electronic device according to the first embodiment when illustrated at a section which is orthogonal to a longitudinal direction.

As illustrated in FIG. 15, the gasket 88 includes a core material 94, and a covering material 96 surrounding the core material 94. In the core material 94, the section in the direction which is orthogonal to a longitudinal direction of the gasket 88 has a semicircular shape. The core material 94 is formed of a material (for example, sponge) having elasticity. The covering material 96 is formed into a film shape by being formed of a material (for example, metal) having conductivity. That is, the gasket 88 is a member including both of the elasticity and the conductivity of a surface.

Furthermore, in the gaskets 90 and 92, a section shape of the direction which is orthogonal to the longitudinal direction may adopt the same shape as the gasket 88. However, the lengths of the gaskets 90 and 92 are different from the length of the gasket 88.

In the gasket 88, a portion (flat face of the right side in FIG. 15) of the outside thereof is an adhesive face 98. The gasket 88 is attached to each left plate 46 of the plug-in unit 26 by the adhesive face 98. As illustrated in FIG. 14, the gasket 88 of each plug-in unit 26 is in contact with the right plate 48 of the plug-in unit 26 which is positioned on the further left side of the plug-in unit 26, in the state where the plurality of plug-in units 26 are mounted in the sub-rack 24. However, the gasket 88 of the plug-in unit 26 (case of no plug-in unit 26 on the left side thereof) which is positioned on the leftmost side in FIG. 14 is in contact with the left side plate 54 of the sub-rack 24.

The gasket 90 is attached to a back face (face of the back side) of the front plate 44 by the adhesive face 98. In the state where each of the plug-in units 26 are mounted in the sub-rack 24, the gasket 90 is in contact with a front face 70F of the guiding member 70.

The gasket 92 is attached to the inner face (face of the inside of the sub-rack 24) of the right side plate 56 by the adhesive face 98. In the state where the plug-in unit 26 which is positioned on the rightmost side is mounted in the sub-rack 24, the gasket 88 is in contact with the right plate 48 of the plug-in unit 26.

Therefore, when each of the plug-in unit 26 is mounted within the sub-rack 24, the gaskets 88 and 90 surround the vicinity of the plug-in unit 26 into a rectangular shape, as illustrated in FIG. 5. In particular, the gaskets 88, 90 and 92 surround the plug-in unit 26 which is positioned on the rightmost side into the rectangular shape. Since the gaskets 88, 90 and 92 have conductivity, a state where the vicinity of the plug-in unit 26 is surrounded by the member having conductivity, in other words, a structure where a gap in which an electromagnetic wave leaks is small (preferably, case of no gap) is realized.

The position and the shape of the gasket 90 are a position and a shape which are in contact with the guiding members 70 and 72, before the connector 36 and the connector 40 are electrically connected, in the middle of inserting the plug-in unit 26 into the sub-rack 24.

As illustrated in FIG. 13, a gasket 100 is positioned along the width direction, between the guiding member 70 and the lower plate 50 of the sub-rack 24, and between the guiding member 72 and the upper plate 52 of the sub-rack 24. Furthermore, the structure where the gasket 100 is positioned between the guiding member 72 and the upper plate 52 is illustrated in FIG. 13, but there is a structure where the gasket 100 is similarly positioned between the guiding member 70 and the lower plate 50.

The gasket 100 includes the core material having elasticity, and the covering material having conductivity in the vicinity of the core material, in the same manner as the gasket 88. However, the section shape of the direction which is orthogonal to the longitudinal direction is not limited to the shape (semicircular shape) illustrated in FIG. 15.

For example, the gasket 100 is attached to the step portions 62 and 66 of the lower plate 50 and the upper plate 52, and is in contact with the guiding members 70 and 72. When the guiding members 70 and 72 slide in the front-back direction, the guiding members 70 and 72 slide while the state of being in contact with the gasket 100 is maintained. That is, the guiding members 70 and 72, and the sub-rack 24 are maintained in a conduction state (state of being electrically connected), by the gasket 100.

For example, a structure where the gasket 100 is attached to the guiding members 70 and 72, and slides in the front-back direction by being integrated with the guiding members 70 and 72 may be adopted. In this case, the gasket 100 slides while the state of being in contact with the lower plate 50 or the upper plate 52 is maintained.

As illustrated in FIG. 12 and FIG. 13, each lever 102 is arranged in the upper portion and the lower portion of the front panel 42. Each of the levers 102 are supported to be rotatably moved with respect to the front panel 42, by a shaft 104 along the width direction.

One end side of the lever 102 is an operation portion 106 for which a worker operates the lever 102 to be rotated. The lever 102 is rotationally moved between a disengaging position RP (see FIG. 16A) where the operation portion 106 becomes almost horizontal and an engaging position KP (see FIG. 12) where the operation portion 106 becomes almost vertical (parallel to the front plate 44).

As illustrated in FIG. 16A to FIG. 16D, FIG. 17A and FIG. 17B, an engaging claw 108 and a contact claw 110 are formed on the other end side of the lever 102. In contrast thereto, each engaging hole 112 is formed in the step portion 62 of the lower plate 50 and the step portion 66 of the upper plate 52. Furthermore, each contact wall 114 is formed on the front side of the engaging hole 112, in the step portions 62 and 66.

Figure 16A:
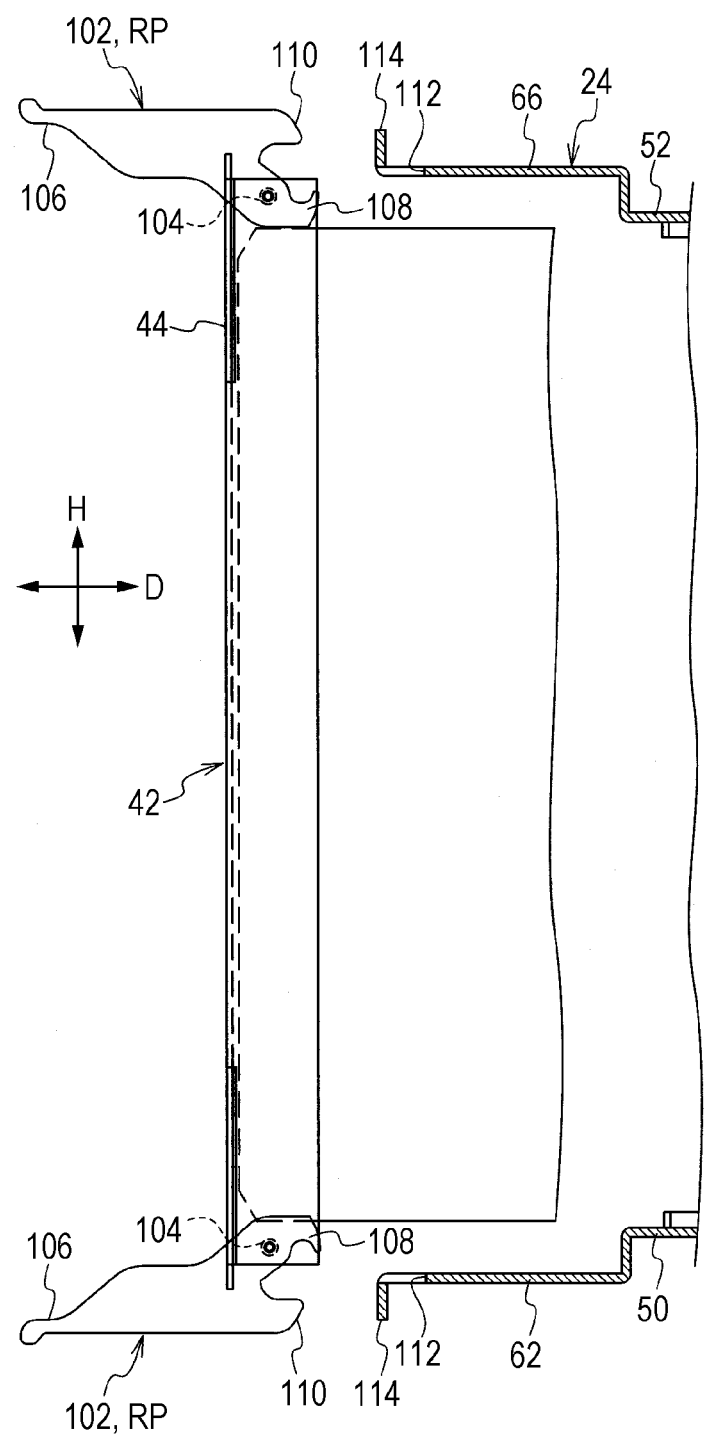
FIG. 16A is a sectional view illustrating the electronic device according to the first embodiment in the enlarged state at the vicinity of a lever.
Figure 16B:
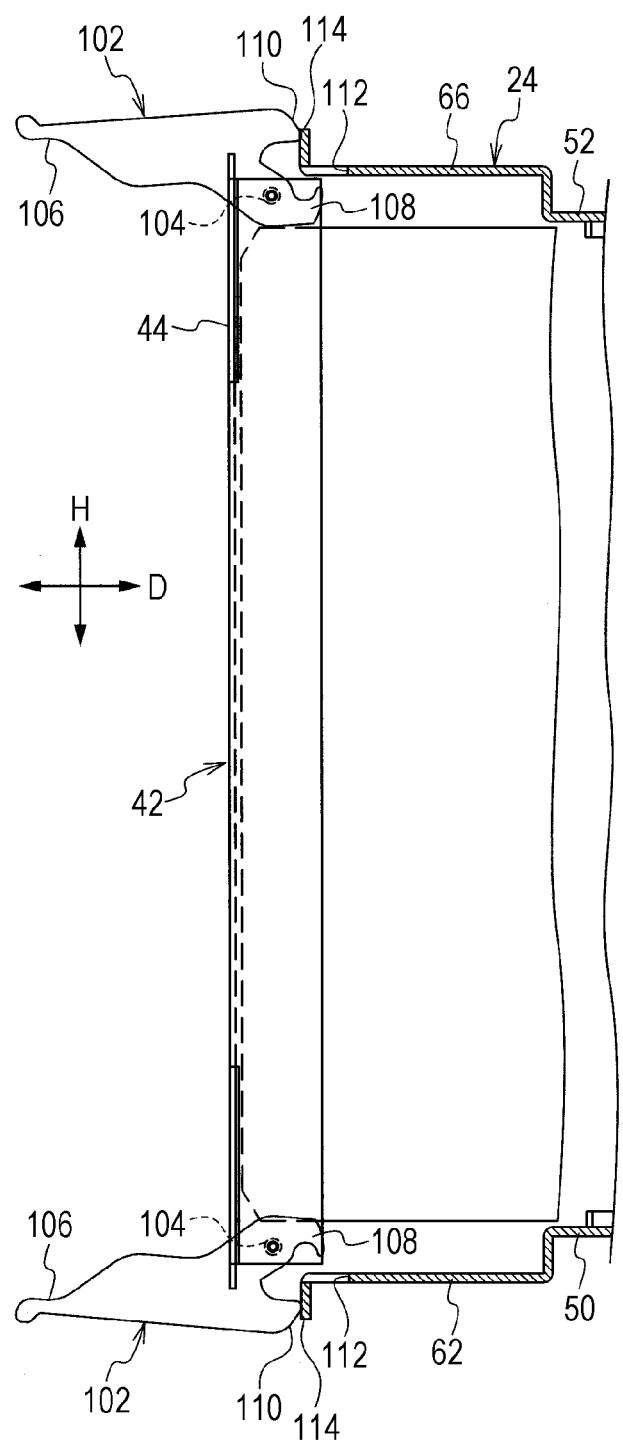
FIG. 16B is a sectional view illustrating the electronic device according to the first embodiment in the enlarged state at the vicinity of the lever.
Figure 16C:
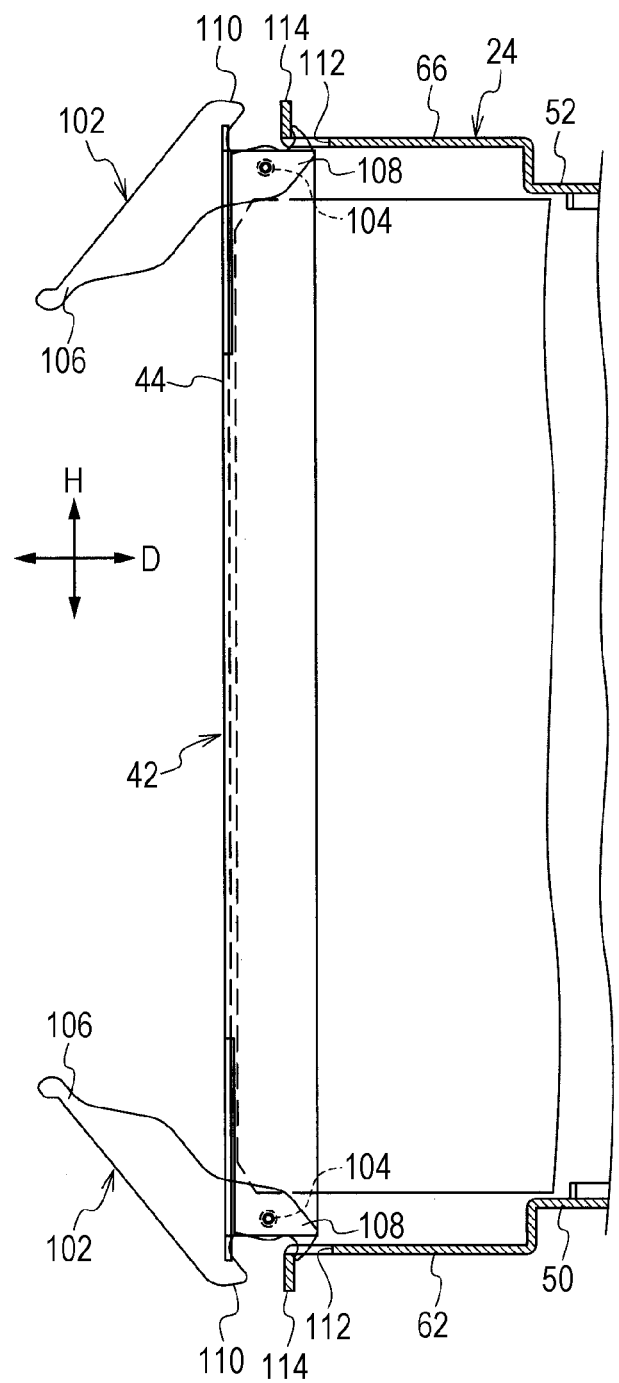
FIG. 16C is a sectional view illustrating the electronic device according to the first embodiment in the enlarged state at the vicinity of the lever.

As illustrated in FIG. 16A, the lever 102 is positioned at the disengaging position RP, before the plug-in unit 26 is inserted into the sub-rack 24. At this time, when the plug-in unit 26 is moved to the back side, each of the contact claws 110 comes in contact with the contact wall 114, as illustrated in FIG. 16B. Here, when each of the levers 102 is rotationally moved toward the engaging position KP, each of the engaging claws 108 enters the engaging hole 112, and is caught by the back face of the contact wall 114, in the middle of rotationally moving the lever 102, as illustrated in FIG. 16C. When each of the lever 102 is further rotationally moved toward the engaging position KP, the plug-in unit 26 is moved to the back side, and is mounted in a mounting position, due to "principle of lever" by the lever 102, as illustrated in FIG. 16D.

Figure 17A:
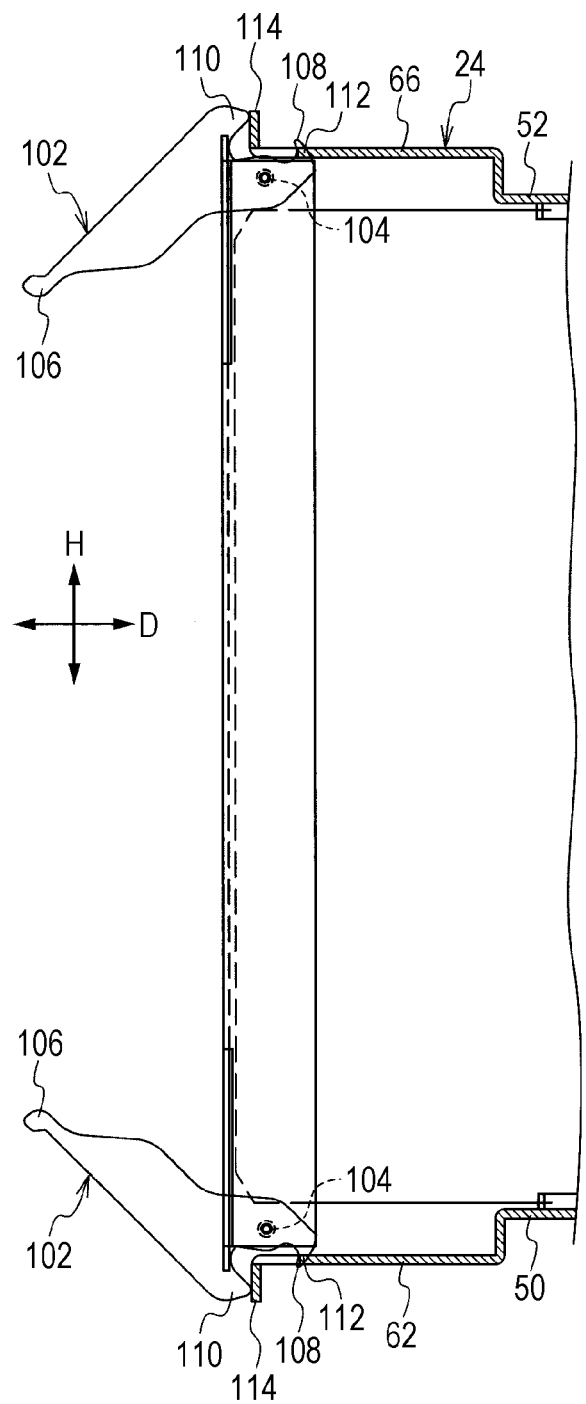
FIG. 17A is a sectional view illustrating the electronic device according to the first embodiment in the enlarged state at the vicinity of the lever.

When the plug-in unit 26 is drawn out from the sub-rack 24, the levers 102 are rotationally moved toward the disengaging position RP, as illustrated in FIG. 17A. In the middle of rotationally moving the levers 102, each of the contact claws 110 of the levers 102 comes in contact with the front face of the contact wall 114.

Figure 17B:
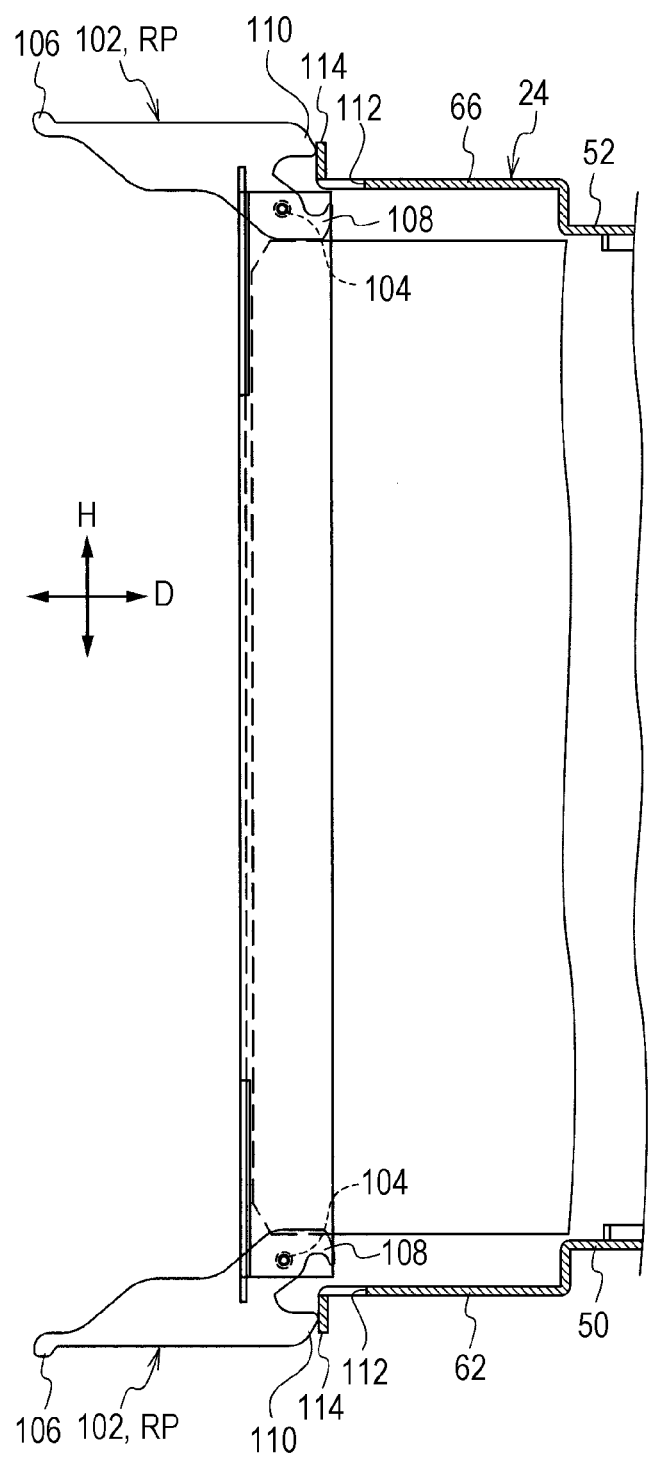
FIG. 17B is a sectional view illustrating the electronic device according to the first embodiment in the enlarged state at the vicinity of the lever.

As illustrated in FIG. 17B, when each of the levers 102 is further rotationally moved toward the disengaging position RP, the engaging claw 108 of each of the levers 102 is slipped out from the engaging hole 112. Hereby, the plug-in unit 26 is pulled to the front side, and may be drawn out from the sub-rack 24.

Next, an effect of the first embodiment, and a mounting method for mounting the plug-in unit 26 in the sub-rack 24 will be described.

In the first embodiment, when the plug-in unit 26 is inserted into the sub-rack 24, a portion (upper edge portion and lower edge portion 32E) of the printed circuit board 32 is accommodated in the accommodation grooves 84 of the guiding members 70 and 72. Hereby, since the plug-in unit 26 are aligned with respect to the sub-rack 24, a mounting work becomes easy.

In particular, each guiding member 70 is positioned at the protruding position AP, in the state before the plug-in unit 26 is mounted in the sub-rack 24. A portion of each guiding member 70 protrudes to the front side from the sub-rack 24. Therefore, a portion of the accommodation groove 84 of the guiding member 70 is also positioned on the front side of the sub-rack 24.

Accordingly, an insertion position (mounting position) at the time of inserting the plug-in unit 26 into the sub-rack 24 is likely to be confirmed by sight, in comparison with a structure where the guiding member 70 is not included, or a structure where the guiding member 70 does not protrude to the front side of the sub-rack 24. Hence, the work of aligning the plug-in unit 26 becomes easy.

In the first embodiment, the guiding member 70 includes the accommodation groove 84. By accommodating a portion (upper edge portion and lower edge portion 32E of the printed circuit board 32) of the plug-in unit 26 in the accommodation groove 84, the plug-in unit 26 is retained in the width direction. Since a posture of the plug-in unit 26 is stable at the time of inserting the plug-in unit 26 into the sub-rack 24 in comparison with a structure where the guiding members 70 and 72 do not include the accommodation groove 84, the insertion becomes easy.

The taper portion 86 of which the groove width gradually increases toward the front side is formed in the accommodation groove 84. Since the width at the time of accommodating the edge portion 32E of the printed circuit board 32 in the accommodation groove 84 is wide, the work of accommodating a portion of the printed circuit board 32 in the accommodation groove 84 becomes easy, in comparison with a structure where the taper portion 86 is not formed.

When the plug-in unit 26 is mounted to the sub-rack 24, the levers 102 each is positioned at the disengaging position RP, as illustrated in FIG. 18. Therefore, each of the upper edge portion and the lower edge portion of the printed circuit board 32 is accommodated in the accommodation groove 84.

Figure 19:
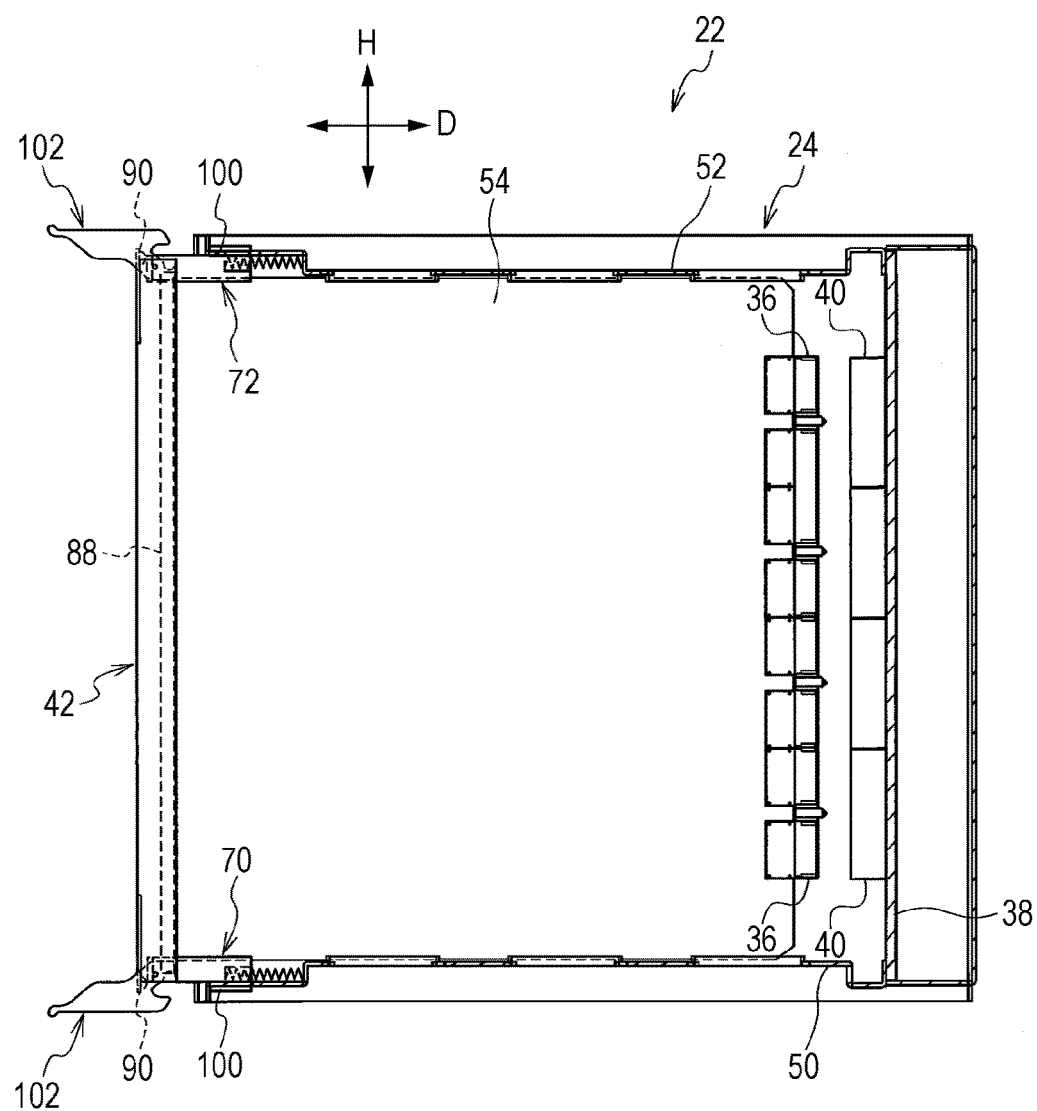
FIG. 19 is a sectional view illustrating the electronic device according to the first embodiment when illustrated at the section of the front-back direction.

Therefore, the plug-in unit 26 is pushed to the back side. At this time, the guiding member 70 is not moved to the back side, and a deviation of the position to the back side may be generated between the guiding member 70 and the plug-in unit 26, as illustrated in FIG. 19.

Before the connectors 36 and 40 are connected, the gasket 88 comes in contact with the guiding member 70. The gasket 88 has conductivity by the covering material 96. All of the guiding member 70, and the upper plate 52 and the lower plate 50 of the sub-rack 24 are manufactured of the metals, and the conduction state is made by the gasket 100 between the guiding member 70, the upper plate 52 and the lower plate 50. Accordingly, the electricity of the plug-in unit 26 is discharged to the earth through the gasket 88, the guiding member 70, the gasket 100, and the sub-rack 24 (upper plate 52 and lower plate 50).

For example, even when the worker who mounts the plug-in unit 26 in the sub-rack 24 is electrified, the electricity which is carried by the worker is discharged before the connectors 36 and 40 are connected.

Furthermore, the guiding member 70 is hit with the spring stand 80, and a further movement to the back side is stopped. The spring force of the coil spring 82 affects the movement of the guiding member 70 to the back side in a reverse direction. Hence, a movement speed of the plug-in unit 26 to the back side is also moderated. Hereby, the damage of a fitting portion of the connectors 36 and 40 may be suppressed. Since the connector 36 is not impactively hit with the connector 40, for example, an influence by a vibration or the like on another plug-in unit 26 may be moderated, before the connector 36 is connected to the connector 40.

Figure 20:
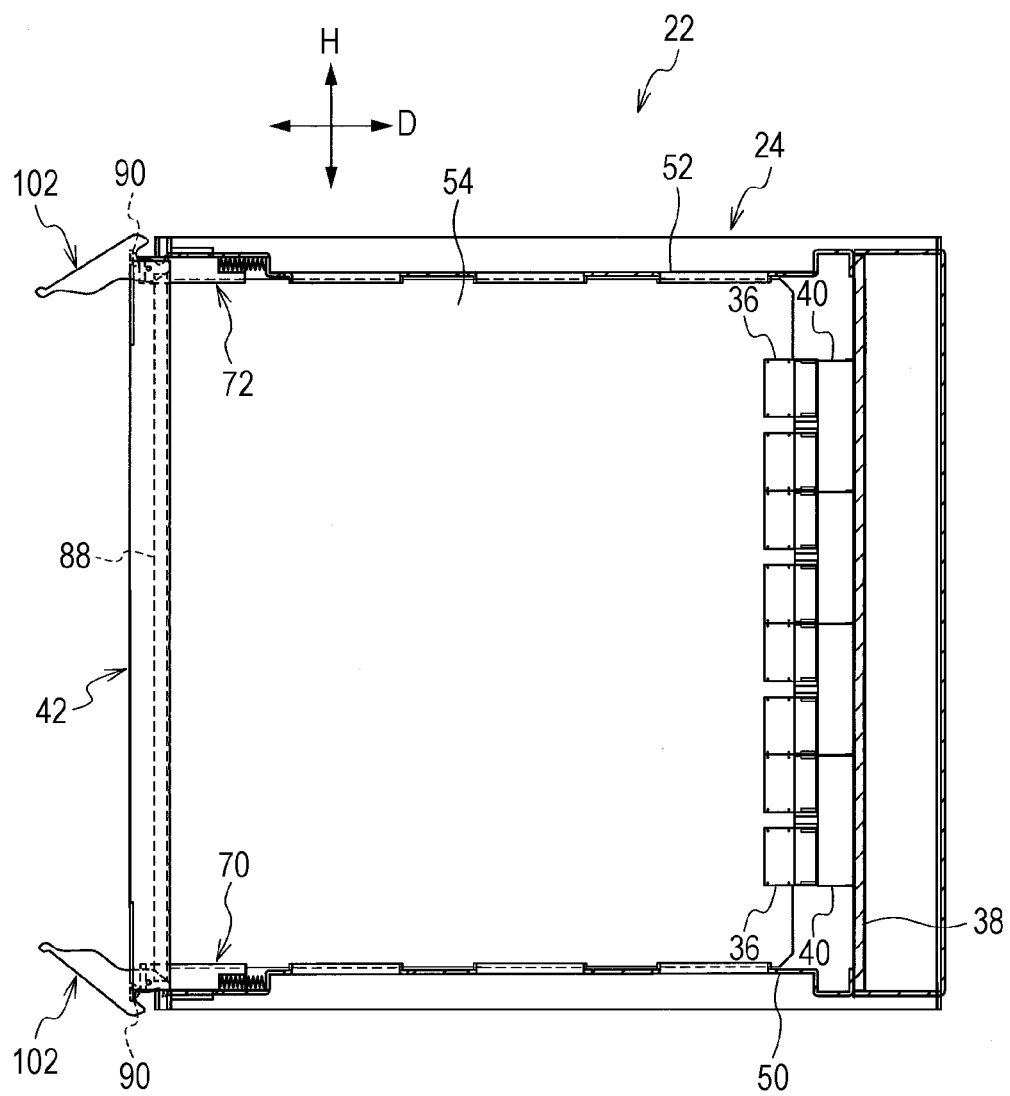
FIG. 20 is a sectional view illustrating the electronic device according to the first embodiment when illustrated at the section of the front-back direction.

Therefore, the contact claw 110 of each of the lever 102 comes in contact with the contact wall 114 in the middle of moving the plug-in unit 26 to the back side, as illustrated in FIG. 16A to FIG. 16D. In such the state, the lever 102 is rotationally moved toward the engaging position KP. As illustrated in FIG. 16C, the engaging claws 108 each enters the engaging hole 112, and is caught by the back face of the contact wall 114. At this time, the connectors 36 and 40 are in contact with each other, as illustrated in FIG. 20.

When the levers 102 each is further rotationally moved toward the engaging position KP, the plug-in unit 26 is moved to the back side, by "principle of lever". Therefore, as illustrated in FIG. 21, the plug-in unit 26 is mounted to the mounting position. When the plug-in unit 26 reaches the mounting position, the connectors 36 and 40 are electrically connected. At this time, the levers 102 each is positioned at the engaging position KP, as illustrated in FIG. 16D.

In this manner, in the first embodiment, by operating the lever 102, the plug-in unit 26 may be mounted by being moved to the back side of the sub-rack 24, and the mounting work becomes easy. Moreover, it is possible to enhance reliability of the connection of the connectors 36 and 40, by "the principle of leverage" of the lever 102. Still more, similarly, it is possible to strongly push the gaskets 90 to the guiding members 70 and 72, by "principle of lever" of the lever 102. Furthermore, since the engaging claws 108 each is caught by the back face of the contact wall 114 by entering the engaging hole 112, it is possible to suppress the movement of the plug-in unit 26, and it is possible to maintain the state where the gaskets 90 are in contact with the guiding members 70 and 72.

In the first embodiment, as described above, the electricity which is carried by the worker may be discharged to the earth, before the connectors 36 and 40 are electrically connected. Hence, the electricity which is carried by the worker does not affect another plug-in unit 26 through the backplane 38, and does not have the influence on the electronic component of another plug-in unit 26.

Here, in order to electrically connect the plug-in unit 26 to the sub-rack 24 before the connection of the connectors 36 and 40, for example, a structure where the front panel 42 is extended (enlarged) to the back side is considered. That is, there is a structure where the plug-in unit 26 is electrically connected to the sub-rack 24 before the connection of the connectors 36 and 40, by attaching the member for the electrical connection to the housing into the extended portion. However, when the above-described extended portion is arranged, the extended portion is positioned in a passing region (ventilation region) of the wind within the housing. Within the region which is surrounded into the box shape by the extended portion, since the upper portion and the lower portion are closed by the extended portion, there is a concern of becoming the region where the wind for cooling is unlikely to hit.

In contrast thereto, in the first embodiment, since the above-described extended portion is not arranged in the front panel 42, it is possible to widely secure the passing region of the wind within the sub-rack 24.

As illustrated in FIG. 5, when the electronic device 22 is viewed from the front face in the state where the plug-in unit 26 is mounted in the mounting position within the sub-rack 24, the front panel 42 of each plug-in unit 26 is continuous in the width direction. The front face of the sub-rack 24 is formed by the front panels 42 which are continuous in this manner, and it is possible to suppress the leakage of the electromagnetic wave from the inside.

When the electronic device 22 is viewed from the front face, the printed circuit board 32 and the electronic component 34 are surrounded by the gaskets 88 and 90 (or gaskets 88, 90 and 92). The whole of the plug-in unit 26 is covered by the sub-rack 24, the guiding member 70, and the front panel 42 which are manufactured by the metals. Therefore, the gap between the sub-rack 24 and the front panel 42 is sealed by the gaskets 88, 90 and 92. Hereby, even when the electromagnetic wave is generated in the electronic component 34, the electromagnetic wave is inhibited from leaking to the outside from the sub-rack 24. For example, even when the strong electromagnetic wave is generated in accordance with the speeding-up of an electronic circuit in the plug-in unit 26, it is possible to suppress the leakage of the electromagnetic wave.

Furthermore, the gasket 88 and the gasket 92 may include a structure of replacing the left and the right of the width direction. That is, a structure where the gasket 88 is attached to the right plate 48, and the gasket 88 is in contact with the left plate 46 of the plug-in unit 26 which is adjacent to the right side of the gasket 88, may be adopted. In this case, the gasket 92 is attached to the left side plate 54, and may be in contact with the left plate 46 of the plug-in unit 26 on the leftmost side.

When the plug-in unit 26 is drawn out from the sub-rack 24, the lever 102 each is rotationally moved toward the disengaging position RP from the engaging position KP, as illustrated in FIG. 17A. In the middle of rotationally moving the lever 102, the contact claw 110 is in contact with the front face of the contact wall 114, but when the lever 102 is further rotationally moved, the engaging claw 108 is slipped out from the engaging hole 112 while the plug-in unit 26 is moved to the front side. By moving the plug-in unit 26 to the front side, the connection of the connectors 36 and 40 is released.

As illustrated in FIG. 17B, by pulling out the plug-in unit 26 to the front side in the state of rotationally moving the lever 102 up to the disengaging position RP, it is possible to draw out the plug-in unit 26 from the sub-rack 24.

In this manner, by operating the lever 102 each, it is possible to move the plug-in unit 26 to the back side (connection direction) and the front side (disconnection direction) with respect to the sub-rack 24, and the mounting of the plug-in unit 26 to the sub-rack 24, and a removal thereof become easy.

Next, a second embodiment will be described. In the second embodiment, the same sign is attached to the element or the member which is the same as the first embodiment, and the detailed description thereof will be omitted.

In an electronic device 122 according to the second embodiment, the guiding member 70 includes a lock member 124. The lock member 124 is a member which locks and unlocks the movement of the guiding member 70 when the guiding member 70 is positioned at the protruding position AP.

Figure 22:
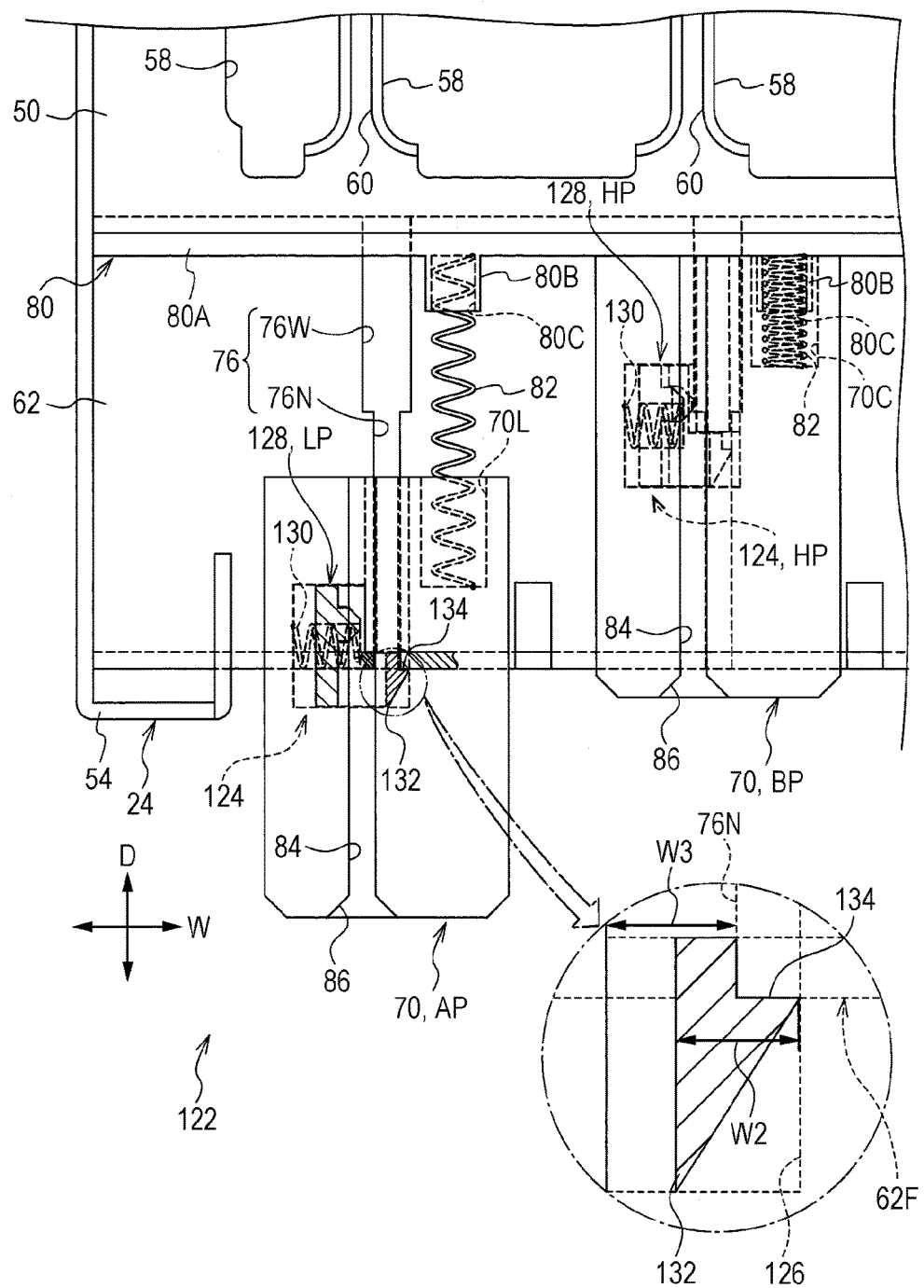
FIG. 22 is a plan view illustrating an electronic device according to a second embodiment in an enlarged state at the vicinity of a guiding member.
Figure 23:
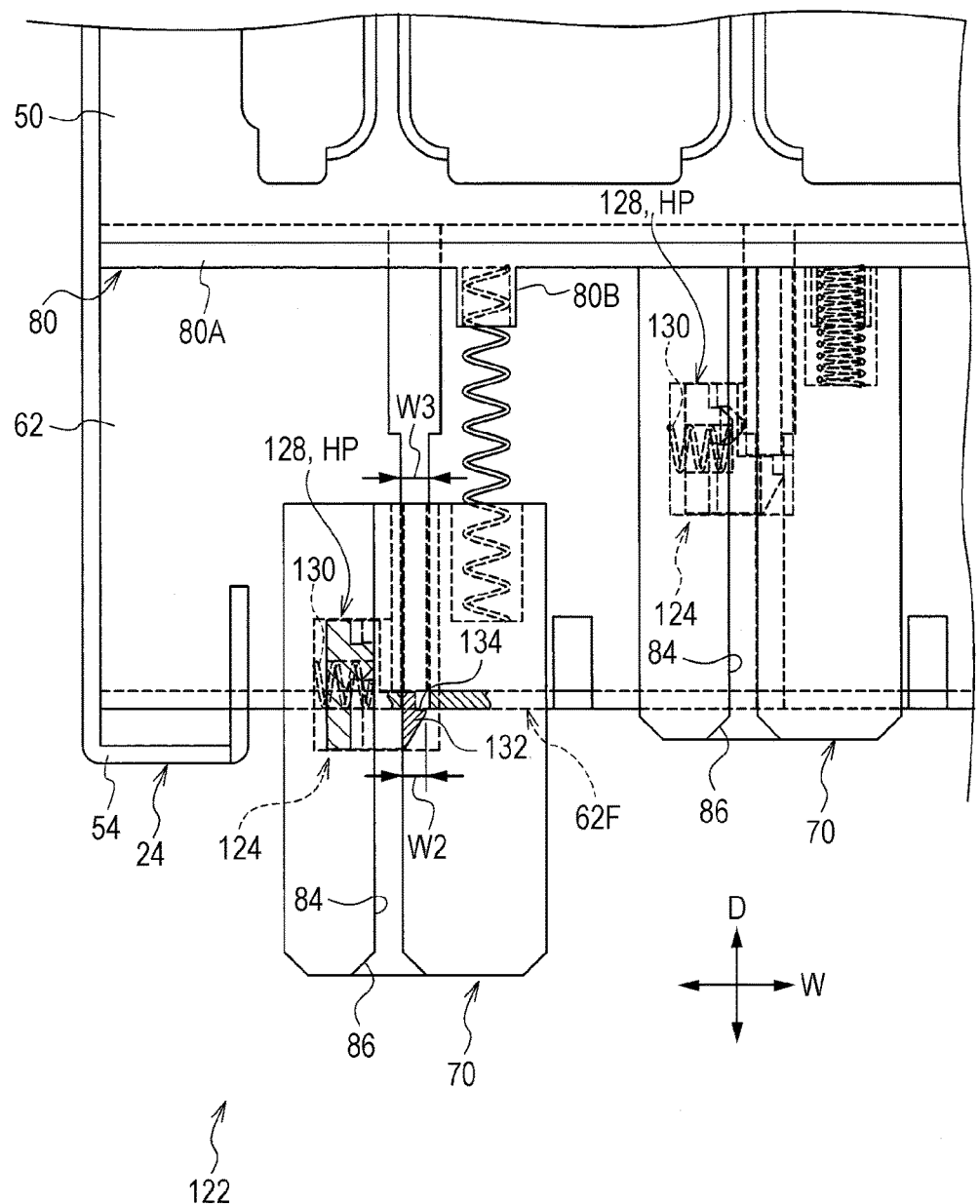
FIG. 23 is a plan view illustrating the electronic device according to the second embodiment in the enlarged state at the vicinity of the guiding member.
Figure 24:
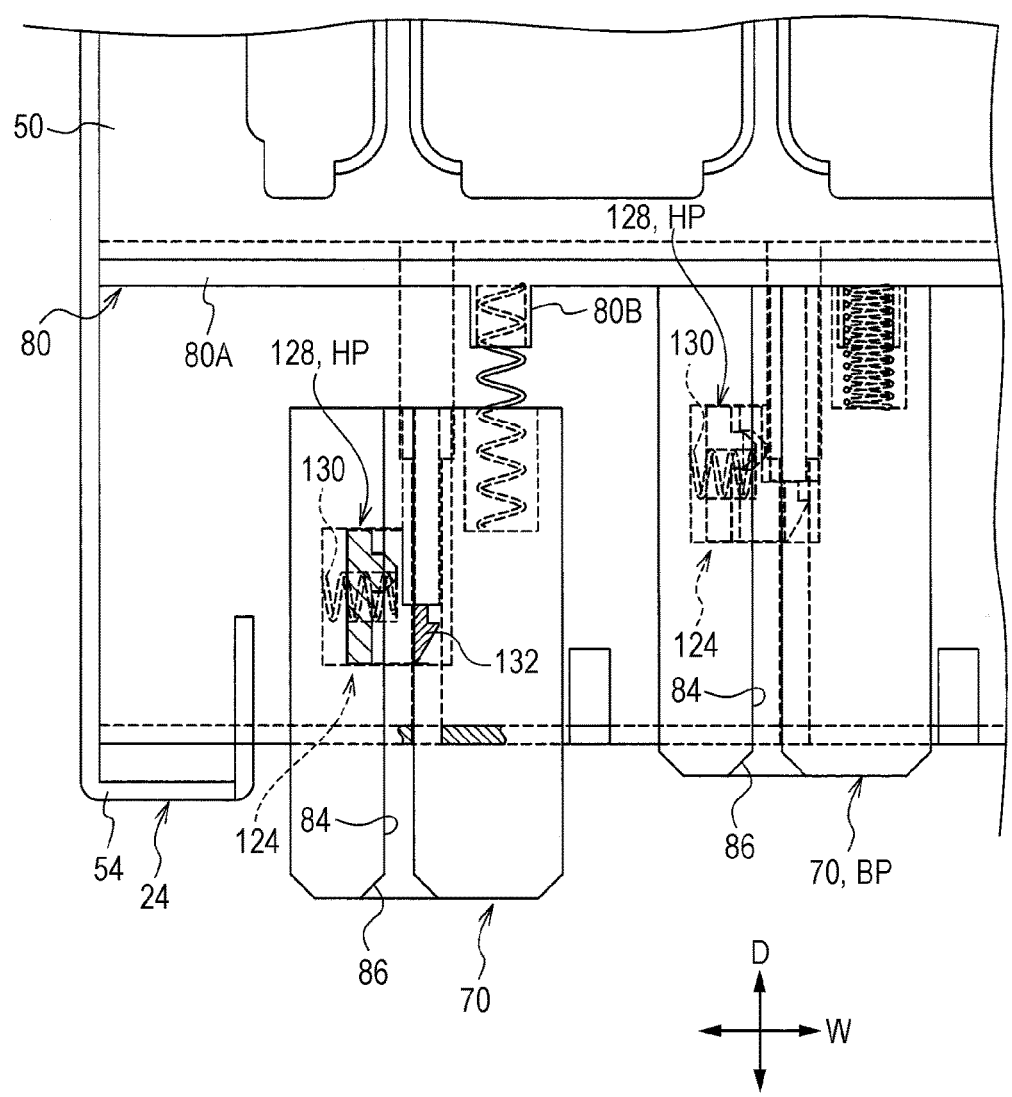
FIG. 24 is a plan view illustrating the electronic device according to the second embodiment in the enlarged state at the vicinity of the guiding member.
Figure 28:
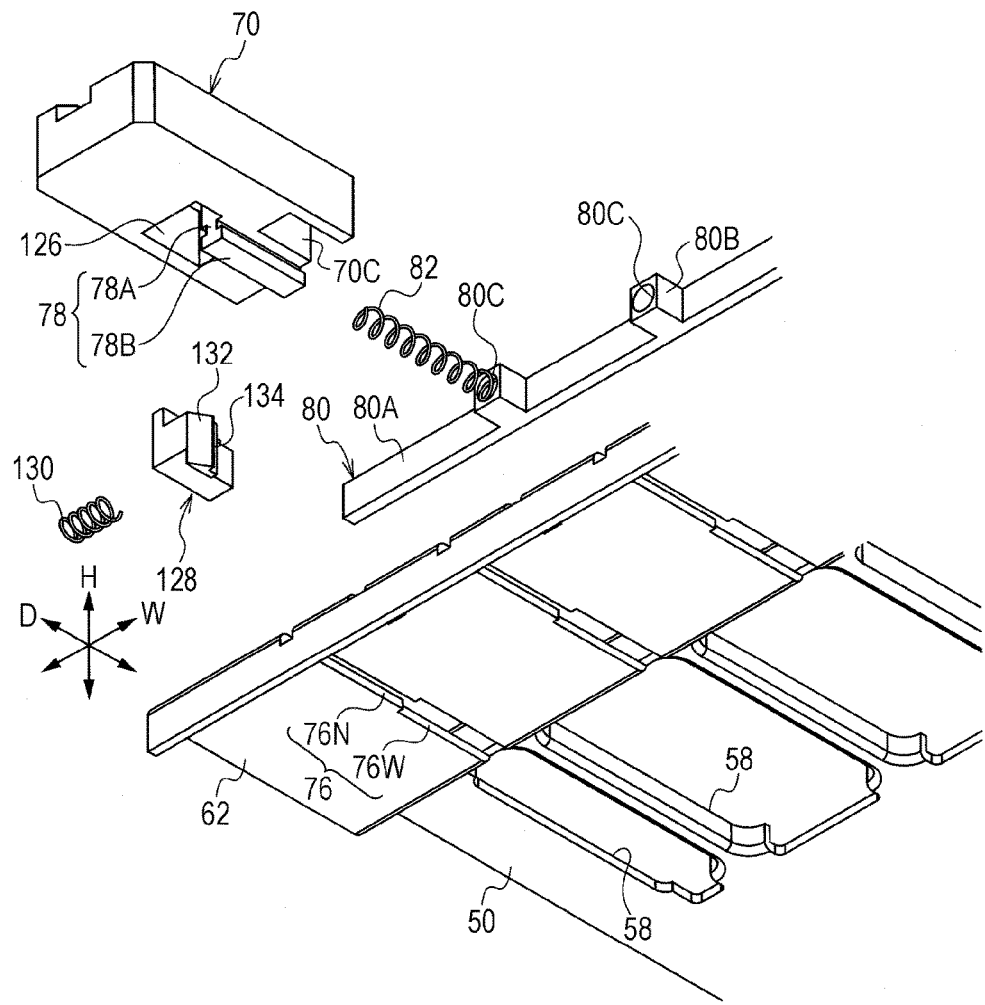
FIG. 28 is an exploded perspective view illustrating the sub-rack of the electronic device according to the second embodiment in the enlarged state at the vicinity of the guiding member.

As illustrated in FIG. 28, an accommodation concave portion 126 is formed on the face of the opposite side to the opposing face 74, in the guiding member 70. A portion of a lock component 128 is accommodated in the accommodation concave portion 126. As illustrated in FIG. 22 to FIG. 24, between a lock position LP and an unlock position HP, the lock component 128 is movable in the width direction (arrow W direction).

A lock biasing spring 130 is positioned between the accommodation concave portion 126 and the lock component 128. The lock biasing spring 130 biases the lock component 128 toward the lock position LP.

The lock component 128 includes a lock piece 132. In the second embodiment, the lock piece 132 protrudes from the lock component 128 on the right side of the width direction. The face of the back side of the lock piece 132 is a locking face 134.

Figure 27:
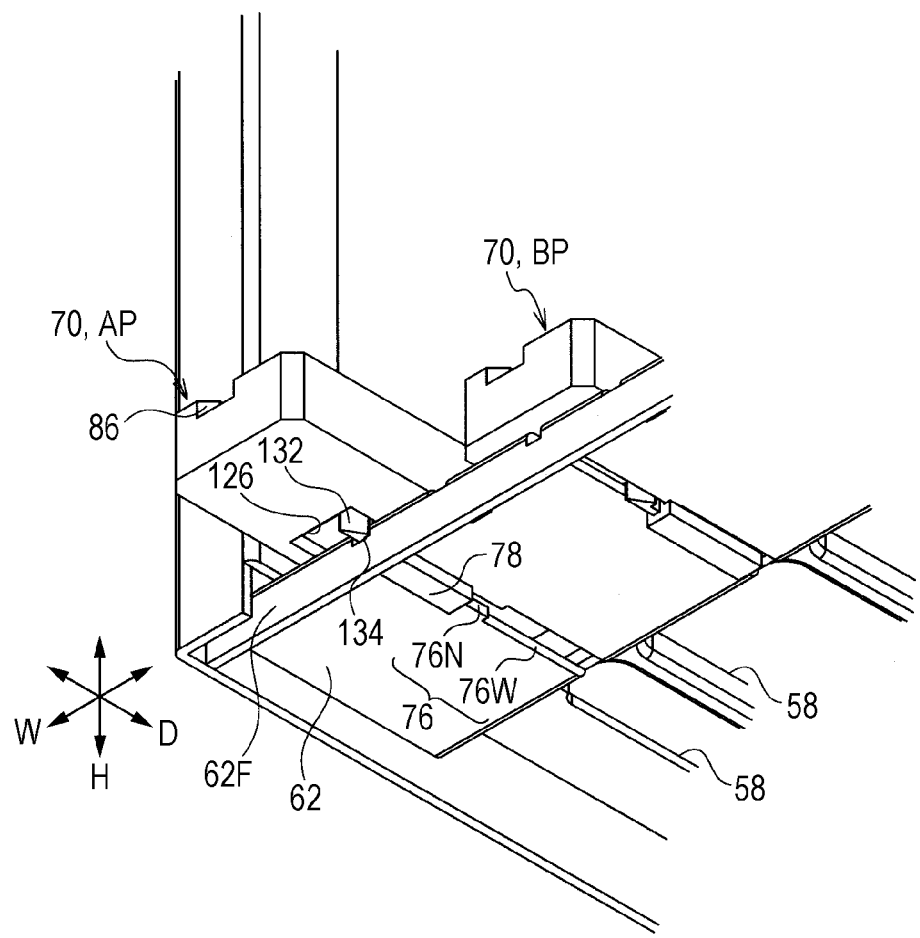
FIG. 27 is a perspective view illustrating the sub-rack of the electronic device according to the second embodiment in the enlarged state at the vicinity of the guiding member.

A width W2 of the lock piece 132 is shorter than a width W3 of the width narrowing portion 76N of the slit 76. The lock piece 132 is moved in the width narrowing portion 76N, but as illustrated in FIG. 22 and FIG. 27, the lock piece 132 is slipped out to the front side of the slit 76, in the state where the guiding member 70 is positioned at the protruding position AP. Therefore, the lock component 128 is positioned at the lock position LP by being biased with the lock biasing spring 130. In the lock position LP, the locking face 134 is locked with a front face 62F of the step portion 62. Hence, the movement of the guiding member 70 to the back side is locked.

Figure 25:
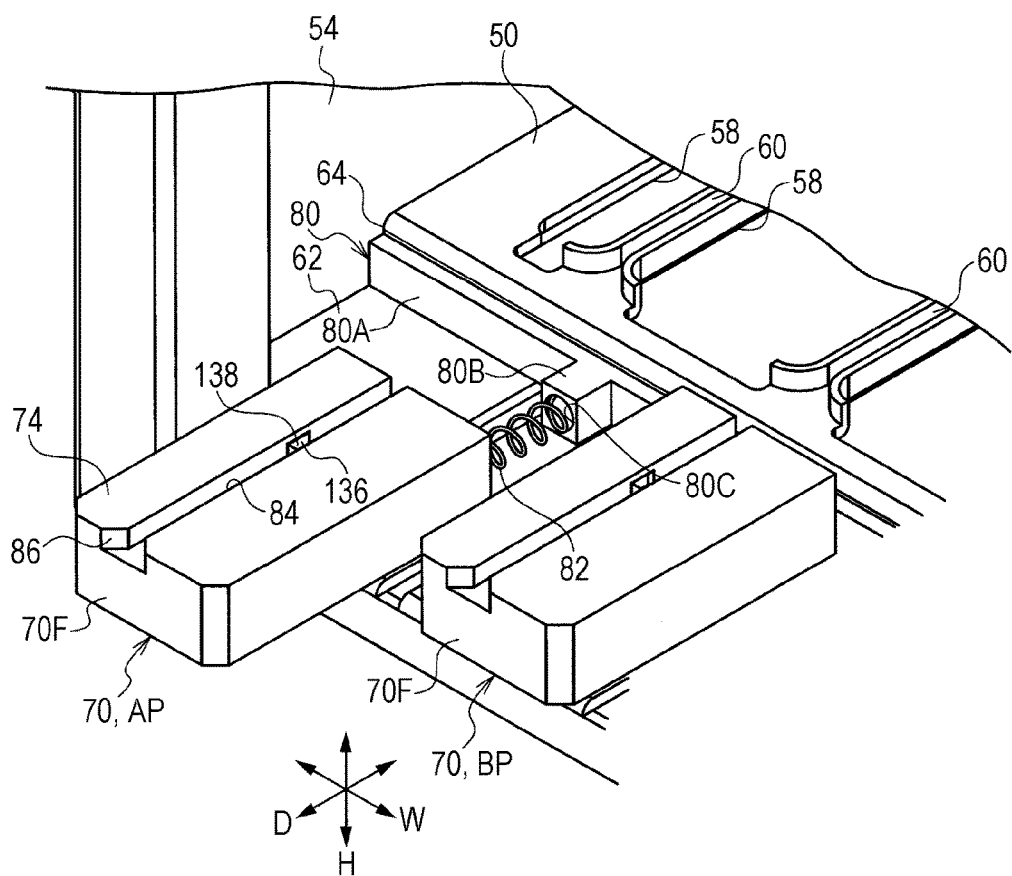
FIG. 25 is a perspective view illustrating a sub-rack of the electronic device according to the second embodiment in the enlarged state at the vicinity of the guiding member.
Figure 26:
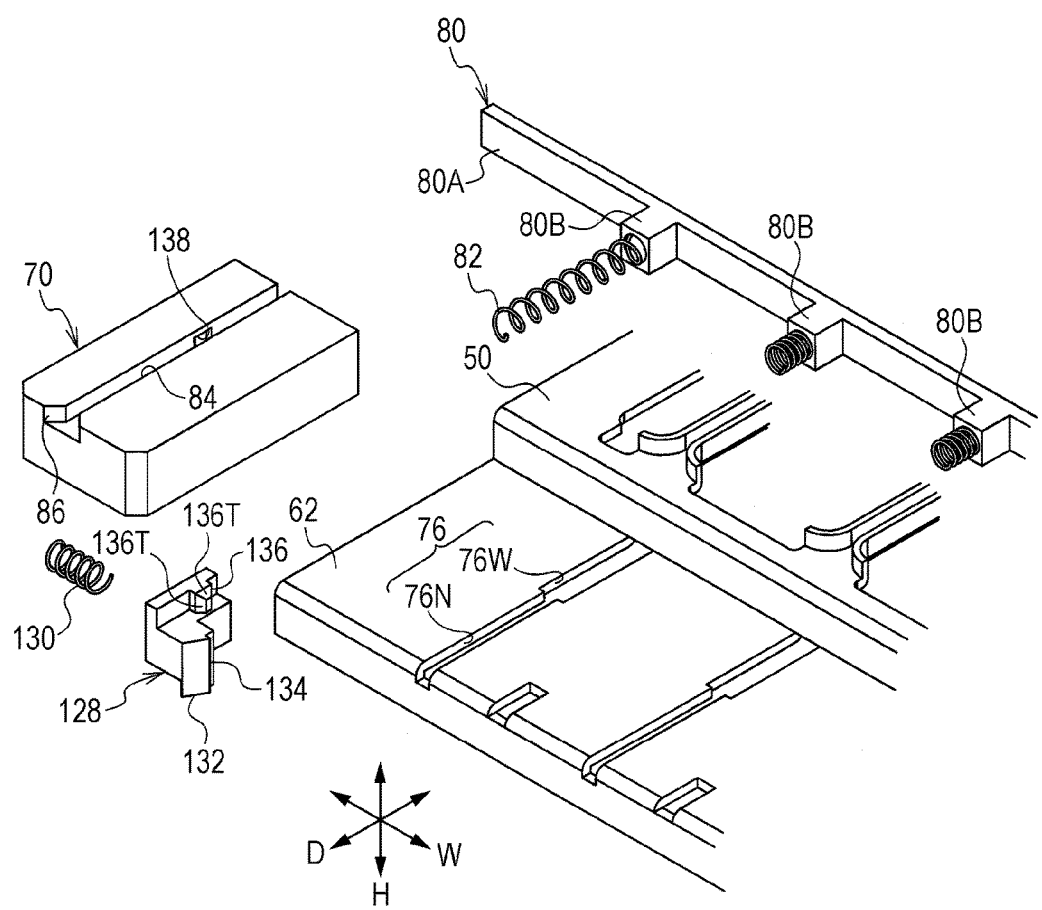
FIG. 26 is an exploded perspective view illustrating the sub-rack of the electronic device according to the second embodiment in the enlarged state at the vicinity of the guiding member.

The lock component 128 includes a protruding portion 136. In the second embodiment, as illustrated in FIG. 25 and FIG. 26, a hole portion 138 is formed in a side wall of the accommodation groove 84. When the lock component 128 is positioned at the lock position LP, the protruding portion 136 passes through the hole portion 138, and a tip portion of the protruding portion 136 is positioned within the accommodation groove 84.

Here, when a portion (edge portion 32E) of the printed circuit board 32 is accommodated in the accommodation groove 84, and the protruding portion 136 is pushed in an unlock direction, the lock component 128 is moved in the unlock direction by resisting the spring force of the lock biasing spring 130, as illustrated in FIG. 23. Therefore, when the locking of the locking face 134 with respect to the front face 62F is released, the guiding member 70 is movable to the back side.

In this manner, the guiding member 70 is movable to the retracting position BP, in the state where the lock component 128 is positioned at the unlock position HP, as illustrated in FIG. 24.

Each taper face 136T is formed on the upper face and the front face of the protruding portion 136. The taper face 136T is a face which is inclined so that the direction of the force by which the printed circuit board 32 pushes the protruding portion 136 is converted into the unlock direction.

In the second embodiment, the lock member 124 may inhibit the guiding member 70 from being carelessly moved to the back side (retracting position BP), in this manner. In other words, in the second embodiment, it is possible to lock the guiding member 70 at the protruding position AP. Hence, since the guiding member 70 is not moved to the back side at the time of the work of accommodating a portion (edge portion 32E) of the printed circuit board 32 in the accommodation groove 84, the accommodating work becomes easy.

Therefore, the printed circuit board 32 of which the edge portion 32E is accommodated in the accommodation groove 84 pushes the protruding portion 136, and thereby, the lock of the guiding member 70 may be released by the lock member 124. That is, a special operation for releasing the lock of the guiding member 70 does not have to be performed, and workability thereof is excellent.

Since the taper face 136T is formed in the protruding portion 136, the direction of the force when the printed circuit board 32 pushed the protruding portion 136, may be converted into the unlock direction. That is, in the operation of accommodating the edge portion 32E of the printed circuit board 32 in the accommodation groove 84, the lock of the guiding member 70 may be released by the lock member 124.

Next, a third embodiment will be described. In the third embodiment, the same sign is attached to the element or the member which is the same as the first embodiment, and the detailed description thereof will be omitted.

Figure 29:
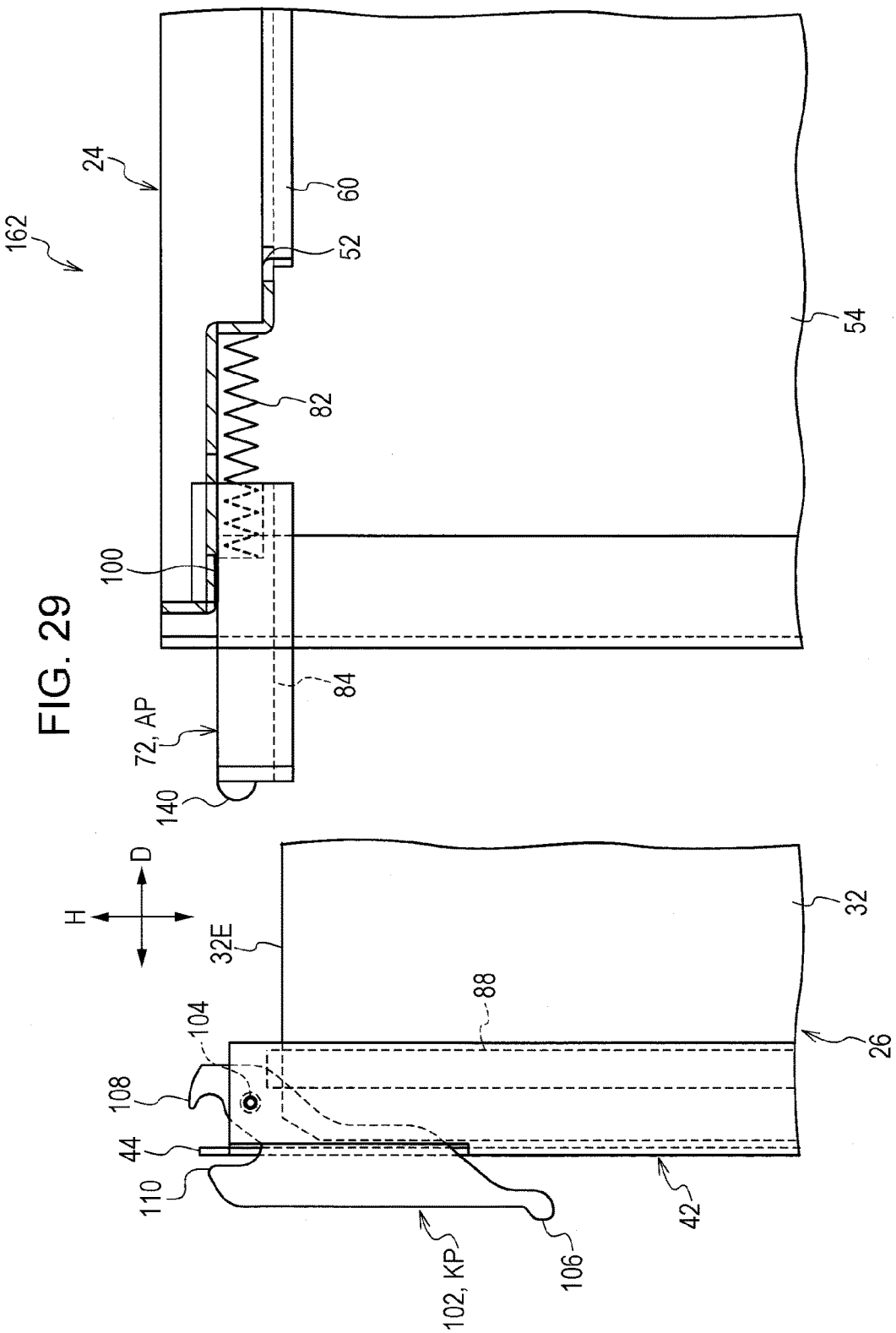
FIG. 29 is an enlarged sectional view illustrating an electronic device according to a third embodiment when illustrated at the section of the front-back direction.

As illustrated in FIG. 29, an electronic device 162 according to the third embodiment, includes a gasket 140, instead of the gasket 90 (see FIG. 13). The gasket 140 is attached to the front faces 70F and 72F of the guiding members 70 and 72, that is, the face opposing to the front plate 44 of the plug-in unit 26.

Furthermore, only the vicinity of the guiding member 72 on the upper side is illustrated in FIG. 29, but the gasket 140 is attached thereto, in the same manner as the guiding member 70 of the lower side.

In the third embodiment, the sub-rack 24 includes a gasket which achieves the same effect as the gasket 90. Hence, even in the case of the plug-in unit in which the gasket 90 is not arranged, the plug-in unit may be electrically connected to the sub-rack 24, before the connection of the connectors 36 and 40. Moreover, the leakage of the electromagnetic wave may be suppressed, in the state where the plug-in unit in which the gasket 90 is not arranged is mounted in the sub-rack 24.

Next, a fourth embodiment will be described. In the fourth embodiment, the same sign is attached to the element or the member which is the same as the first embodiment, and the detailed description thereof will be omitted.

Figure 30:
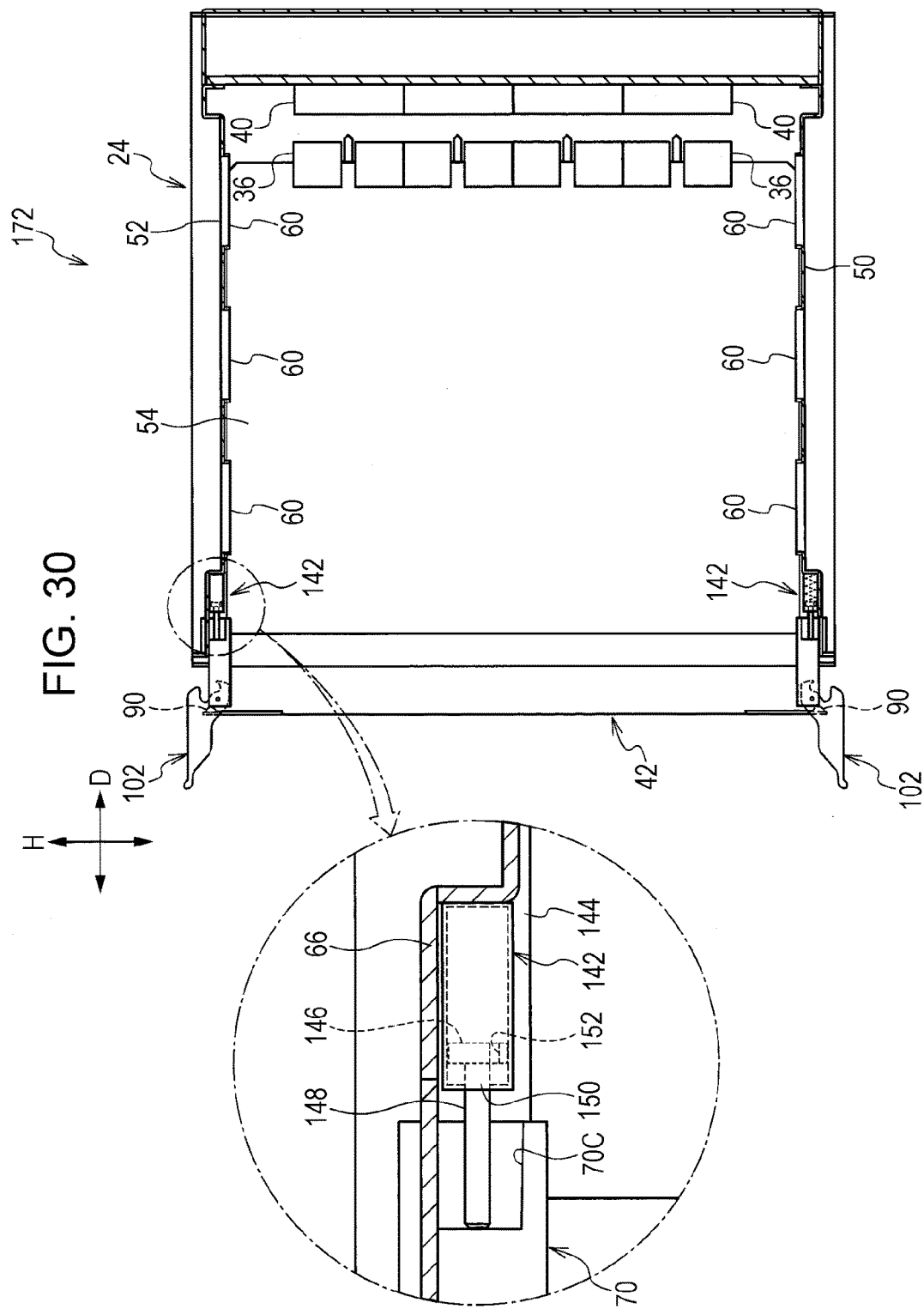
FIG. 30 is a sectional view illustrating an electronic device according to a fourth embodiment when illustrated at the section of the front-back direction.

As illustrated in FIG. 30, a damper 142 is arranged in an electronic device 172 according to the fourth embodiment, instead of the coil spring 82 (see FIG. 13). The damper 142 may be referred to as gas spring.

The damper 142 includes a cylinder 144 having a tube shape. The cylinder 144 is attached to the sub-rack 24.

A piston 146 is accommodated in the cylinder 144. A rod 148 is extended to the front side from the piston 146. The rod 148 passes through an insertion hole 150 of the cylinder 144, and the tip of the rod 148 is attached to the guiding member 70.

The cylinder 144 is filled with the high-pressure gas and oil. When the rod 148 is pushed into the cylinder 144, the gas is compressed by the piston 146. Therefore, the pressure of the gas affects the rod 148 from the piston 146. Hereby, the rod 148 causes the force to the front side to affect the guiding member 70. That is, the damper 142 is an example of the biasing member.

An orifice 152 is formed in the piston 146. When the piston 146 is moved into the cylinder 144, the oil passes through the orifice 152. Therefore, a resistance is generated in the movement of the piston 146, due to the viscosity resistance when the oil passes through the orifice 152. That is, the damper 142 is also an example of a resistance member.

In the fourth embodiment, since the damper 142 causes the force to the front side to affect the guiding member 70, it is possible to maintain the guiding member 70 at the protruding position AP.

Moreover, in the fourth embodiment, when the piston 146 is pushed to the back side through the guiding member 70 and the rod 148 from the plug-in unit 26 at the time of pushing the plug-in unit 26 to the back side, the resistance is generated in the movement of the piston 146. Therefore, the resistance is also generated in the movement of the plug-in unit 26. Since the movement speed of the plug-in unit 26 at the time of mounting the plug-in unit 26 in the sub-rack 24 is suppressed, it is possible to inhibit the impact from affecting the backplane 38 at the time of fitting the connectors 36 and 40. Hereby, the state (connection state) of fitting the connector 36 of another plug-in unit 26 and the connector 40 of the backplane 38 may be inhibited from being unstable. For example, when another plug-in unit 26 is during the operation, the operation state is stably maintained.

Furthermore, in the fourth embodiment, the damper 142 has both of a function of causing the force to the front side to affect the guiding member 70, and a function of generating the resistance in the movement of the guiding member 70 to the back side (suppressing the movement speed). However, such the functions may be realized by separate members. For example, the coil spring 82 of the first embodiment is arranged, and an oil damper which is different from the coil spring 82, or the like may be arranged. In the structure of having the oil damper which is different from the coil spring 82, the coil spring 82 causes the force to the front side to affect the guiding member 70. Therefore, the resistance is generated in the movement of the guiding member 70 to the back side, by the oil damper.

When the damper 142 is used as described in the fourth embodiment, since the resistance member and the biasing member are integrated, it is possible to reduce the number of components.

In each of the embodiments described above, the gasket 90 has elasticity. Accordingly, at the time of inserting the plug-in unit 26 into the sub-rack 24, the impact that is caused in the case where the gasket 90 is in contact with the guiding members 70 and 72 may be moderated. Similarly, the gaskets 88 and 92 have elasticity. Therefore, at the time of inserting the plug-in unit 26 into the sub-rack 24, the impact that is caused in the case where the gaskets 88 and 92 are in contact with the right plate 48 may be moderated.

In each of the embodiments described above, the gasket 100 each is also arranged between the sub-rack 24 and the guiding member 70 and between the sub-rack 24 and the guiding member 72. Even in a structure where the gasket 100 is not arranged, and the guiding members 70 and 72 are in contact with the sub-rack 24, the sub-rack 24 may be electrically connected to the guiding member 70. As described in the above embodiments, in the structure where the gasket 100 is included, it is possible to reliably maintain the state where the sub-rack 24 is electrically connected to the guiding members 70 and 72, by the gasket 100. For example, when the gasket 100 is in contact with the guiding member 70 and the lower plate 50 by being compressed, it is possible to maintain the state of being in contact with both of the guiding member 70 and the sub-rack 24 by elastic restoration of the gasket 100, even when the guiding member 70 is moved in a direction which is separated from the lower plate 50. The gasket 100 between the guiding member 72 and the upper plate 52 is similar thereto.

In the above description, an example in which a pair of guiding members 70 are arranged up and down with respect to one plug-in unit 26 is used, but a structure where the guiding member 70 is arranged only on the lower side or the upper side with respect to one plug-in unit 26 may be adopted. In the structure where the pair of guiding members 70 are arranged up and down with respect to one plug-in unit 26, since the plug-in unit 26 may be guided by the upper and lower guiding members 70, the posture at the time of being inserted into the sub-rack 24 becomes more stable.

In the above description, an example in which a pair of levers 102 are arranged up and down with respect to one plug-in unit 26 is used, but a structure where the lever 102 is arranged only on the lower side or upper side in one plug-in unit 26 may be adopted.

The embodiments are described herein, but the technology which is described in the embodiments is not limited thereto, and regardless to say, may be carried out by being variously modified within the scope without departing from the gist of the embodiments, in addition thereto.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An electronic device comprising:
a housing;
a plug-in unit that is inserted into the housing and electrically connected to a connection substrate within the housing and includes a front panel on a front side of an insertion direction;
a guiding member that includes a retention portion retaining the plug-in unit, the guiding member being moved between a protruding position protruding from the housing to the front side of the insertion direction of the plug-in unit and a retracting position retracting to the housing side, the guiding member being electrically connected to the housing;
a biasing member that biases the guiding member to the protruding position; and
a conductive member that is positioned between the plug-in unit and the guiding member, the plug-in unit and the guiding member being in a conduction state by the conductive member,
wherein the front panel includes a front plate which is provided at the front side of the insertion direction, a left plate which extends from one longitudinal side of the front plate in the insertion direction and a right plate which extends from the other longitudinal side of the front plate in the insertion direction, and
a first portion of the conductive member is provided on a surface of one of the left plate and the right plate and extends from an upper portion of the one of the left plate and the right plate to a lower portion of the one of the left plate and the right plate.

2. The electronic device according to claim 1,
wherein a second portion of the conductive member is provided at an upper portion of the front plate and a lower portion of the front plate and extends in a width direction of the front plate.

3. The electronic device according to claim 1,
wherein the conductive member has elasticity.

4. The electronic device according to claim 1,
wherein a connection member is arranged between the housing and the guiding member and the connection member is electrically connected to the housing and the guiding member.

5. The electronic device according to claim 1,
wherein the retention portion is an accommodation groove formed in the guiding member along the insertion direction of the plug-in unit and the accommodation groove partially accommodates the plug-in unit.

6. The electronic device according to claim 5,
wherein the accommodation groove includes a taper portion whose groove width gradually increasing toward the front side of the insertion direction.

7. The electronic device according to claim 5,
wherein the guiding member includes a lock member which locks the guiding member in the protruding position.

8. The electronic device according to claim 7,
wherein the lock member includes
a lock component that is arranged in the guiding member, the lock component being moved between a lock position at which the lock component is locked by the housing and an unlock position of unlocking locking of the lock component and the housing,
a lock biasing member that biases the lock component to the lock position, and
a protruding portion that is arranged in the lock component, the protruding portion being positioned on an inside of the accommodation groove, the protruding portion moving the lock component to the unlock position by being pushed by the plug-in unit accommodated in the accommodation groove.

9. The electronic device according to claim 1, further comprising:
a resistance member that resists against a movement of the guiding member to the retracting position.

10. The electronic device according to claim 9, further comprising:
a damper in which the resistance member and the biasing member are integrated.

11. The electronic device according to claim 1, further comprising:
a lever that is arranged to be rotatably moved in the plug-in unit and moves the plug-in unit in a connection direction or a disconnection direction with respect to the connection substrate by being rotationally moved in a state of being locked in the housing.

12. A mounting method comprising:
inserting a plug-in unit including a front panel on a front side of an insertion direction into an inside of a housing by retaining a portion of the plug-in unit in a guiding member which protrudes from the housing, the guiding member being electrically connected to the housing;
making the plug-in unit and the guiding member be in a conduction state by a conductive member between the plug-in unit and the guiding member in the middle of the inserting; and
electrically connecting the plug-in unit to a connection substrate within the housing by further inserting the plug-in unit into the housing after the making the conduction state,
wherein the front panel includes a front plate which is provided at the front side of the insertion direction, a left plate which extends from one longitudinal side of the front plate in the insertion direction and a right plate which extends from the other longitudinal side of the front plate in the insertion direction, and
a first portion of the conductive member is provided on a surface of one of the left plate and the right plate and extends from an upper portion of the one of the left plate and the right plate to a lower portion of the one of the left plate and the right plate.

13. The mounting method according to claim 12,
wherein the guiding member is locked at a protruding position of protruding from the housing, and the locked guiding member is unlocked by retaining a portion of the plug-in unit in the guiding member.

14. An electronic device comprising:
a housing;
a plug-in unit that is inserted into the housing, electrically connected to a connection substrate within the housing and includes a front panel on a front side of an insertion direction;
a guiding member that includes a groove that extends along a moving direction of the guiding member and guides the plug-in unit at beginning of insertion of the plug-in unit into the housing, the guiding member being moved between a protruding position protruding from the housing to a front side of an insertion direction of the plug-in unit and a retracting position retracting to the housing side, the guiding member being electrically connected to the housing;
a biasing member that biases the guiding member to the protruding position; and
a conductive member that is positioned between the plug-in unit and the guiding member, the plug-in unit and the guiding member being in a conduction state by the conductive member,
wherein the front panel includes a front plate which is provided at the front side of the insertion direction, a left plate which extends from one longitudinal side of the front plate in the insertion direction and a right plate which extends from the other longitudinal side of the front plate in the insertion direction, and
a first portion of the conductive member is provided on a surface of one of the left plate and the right plate and extends from an upper portion of the one of the left plate and the right plate to a lower portion of the one of the left plate and the right plate.

15. The electronic device according to claim 1,
wherein a third portion of the conductive member is provided on an inner face of the housing on a side of one of the left plate and the right plate where the first portion of the conductive member is not provided.

16. The electronic device according to claim 14,
wherein a third portion of the conductive member is provided on an inner face of the housing on a side of one of the left plate and the right plate where the first portion of the conductive member is not provided.

* * * * *